United States Patent

Murphy et al.

(10) Patent No.: US 11,043,796 B2
(45) Date of Patent: Jun. 22, 2021

(54) QUANTIFICATION OF CHARGE TRANSFER IN CONTINUING CURRENT LIGHTNING EVENTS

(71) Applicant: Vaisala, Inc., Louisville, CO (US)

(72) Inventors: Martin J. Murphy, Boulder, CO (US); Ryan K Said, Broomfield, CO (US)

(73) Assignee: Vaisala, Inc., Louisville, CO (US)

( * ) Notice: Subject to any disclaimer, the term of this patent is extended or adjusted under 35 U.S.C. 154(b) by 0 days.

(21) Appl. No.: 16/865,222

(22) Filed: May 1, 2020

(65) Prior Publication Data

US 2020/0350754 A1 Nov. 5, 2020

Related U.S. Application Data

(60) Provisional application No. 62/842,348, filed on May 2, 2019.

(51) Int. Cl.
*H02G 13/00* (2006.01)
*G01R 29/08* (2006.01)
*G01W 1/16* (2006.01)

(52) U.S. Cl.
CPC ......... *H02G 13/60* (2013.01); *G01R 29/0842* (2013.01); *G01W 1/16* (2013.01)

(58) Field of Classification Search
CPC ...... H02G 13/60; G01R 29/0842; G01W 1/19
See application file for complete search history.

(56) References Cited

U.S. PATENT DOCUMENTS

| 2008/0122424 | A1 | 5/2008 | Zhang et al. |
| 2008/0262732 | A1 | 12/2008 | Davis et al. |
| 2016/0018563 | A1 | 1/2016 | Candor |
| 2019/0187197 | A1 | 6/2019 | Murphy et al. |
| 2020/0173423 | A1* | 6/2020 | Kirkegaard ............ G01R 19/15 |

OTHER PUBLICATIONS

Bitzer, P.M., 2017: Global distribution and properties of continuing current in lightning, J. Geophys. Res. Atmospheres, vol. 122, Issue 2, Jan. 27, 2017, doi: 10.1002/2016JD025532.
(Continued)

*Primary Examiner* — Curtis B Odom
(74) *Attorney, Agent, or Firm* — Maschoff Brennan; Paul G. Johnson

(57) ABSTRACT

Systems and methods are disclosed to detect cloud-to-ground (CG) strokes that include and/or are followed by continuing current (CC). For example, earth-based lightning data may be generated for one or more lightning pulses detected in an environmental space using multiple earth-based lightning detection sensors. Space-based lightning data may be received for one or more optical signals detected in the environmental space using one or more space-based lightning detection sensors. It may be determined from the earth-based and space-based lightning data whether a lightning pulse is a CG stroke that includes or is followed by CC. Charge transfer of a CG stroke with CC may be obtained from measurements of electromagnetic fields by an array of electromagnetic field sensors to generate training data. A machine learning model may be trained to relate space-based and/or earth-based lightning data to charge transfer where there is no proximate array of electromagnetic field sensors.

20 Claims, 6 Drawing Sheets

(56) References Cited

OTHER PUBLICATIONS

Maggio, C.R., T.C. Marshall, and M. Stolzenburg, 2009: Estimations of charge transferred and energy released by lightning flashes, J. Geophys. Res., vol. 114, Issue D14, Jul. 27, 2009, doi: 10.1029/2008JD011506.

M.J. Murphy et al., Cloud Lightning Performance and Climatology of the U.S. Based on the Upgraded U.S. National Lightning Detection Network, Seventh Conf. on Meteorological Applications of Lightning Data, Amer. Meteorol. Soc. (2015).

D. Mach, et al., Performance assessment of the optical transient detector and lightning imaging sensor, Journal of Geophysical Research, (2007).

Zhang, J., 2010: Development and Test of the Langmuir Electric Field Array, M.S. Thesis, Dept. of Electrical Eng., New Mexico Inst. of Mining and Technol.

Geostationary Lightning Mapper (GLM) GOES-R series Fact Sheet ; www.goes-r.gov/spacesegement/glm.html.

https://www.goes-r.gov/spacesegment/glm.html (The Geostationary Lightning Mapper).

NSSL_The National Severe Storms Laboratory; www.nssl.noaa.gov.

* cited by examiner

QUANTIFICATION OF CHARGE TRANSFER IN CONTINUING CURRENT LIGHTNING EVENTS

RELATED APPLICATIONS

This application claims the benefit of U.S. Provisional Application Ser. No. 62/842,348 filed May 2, 2019, which is hereby incorporated herein by reference in its entirety.

This application is related to U.S. Publication No. 2019/0187197 A1 (U.S. application Ser. No. 15/848,674 filed Dec. 20, 2017), which is hereby incorporated herein by reference in its entirety.

BACKGROUND

Lightning pulses may be categorized as cloud-to-ground (CG) strokes or cloud pulses. Continuing current (CC) included in or following CG strokes is a significant problem because CG strokes that include and/or are followed by CC are more likely to start fires and more likely to cause significant damage than strokes that do not include and/or are not followed by CC. Typically only a small fraction of all CG strokes include and/or are followed by CC. As the amount of charge transfer of a CG stroke increases, the risk of fire or other damage increases.

The detection of CC from ground-based lightning detection systems is problematic because it requires sensitive electric or magnetic field measurements at the lower end of the Extremely Low Frequency (ELF; 3-3,000 hertz (Hz)) range. These frequencies are well below the usable sensor sensitivity range of many terrestrial radio lightning locating system (LLS) networks, they attenuate rapidly with distance, and they are typically swamped by anthropogenic noise sources such as that produced by nearby electric power transmission and distribution lines.

The subject matter claimed herein is not limited to embodiments that solve any disadvantages or that operate only in environments such as those described above. Rather, this background is only provided to illustrate one example technology area where some embodiments described herein may be practiced.

SUMMARY OF THE DISCLOSURE

Systems and methods are disclosed to quantify charge transfer by CG strokes that include and/or are followed by CC.

In an example embodiment, a method to quantify charge transfer in continuing current lightning events includes, for each first lightning event of a plurality of first lightning events: obtaining one or more first measurements of each first lightning event from at least one of one or more earth-based lightning detection sensors or one or more space-based lightning detection sensors; obtaining a first charge transfer estimate of each first lightning event using field measurements of each first lightning event from one or more arrays of electromagnetic field sensors; and the one or more first measurements with the first charge transfer estimate in a training data entry of a plurality of training data entries, the plurality of training data entries corresponding to the plurality of first lightning events. The method may further include training a machine learning model using the plurality of training data entries.

In another example embodiment, a non-transitory computer-readable medium has computer-readable instructions stored thereon that are executable by a processor device to perform or control performance of operations. The operations may include, for each first lightning event of a plurality of first lightning events: obtaining one or more first measurements of each first lightning event from at least one of one or more earth-based lightning detection sensors or one or more space-based lightning detection sensors; obtaining a first charge transfer estimate of each first lightning event using field measurements of each first lightning event from one or more arrays of electromagnetic field sensors; and associating the one or more first measurements with the first charge transfer estimate in a training data entry of a plurality of training data entries, the plurality of training data entries corresponding to the plurality of first lightning events. The operations may further include training a machine learning model using the plurality of training data entries.

In another example embodiment, a lightning detection system includes one or more arrays of electromagnetic field sensors configured to detect changes in electromagnetic fields in an environmental space and a processor device communicatively coupled to one or more space-based lightning detection sensors configured to detect one or more optical signals in the environmental space, wherein the processor device is configured to perform or control performance of operations. The operations may include, for each first lightning event of a plurality of first lightning events: obtaining one or more first measurements of each first lightning event from the one or more space-based lightning detection sensors; obtaining a first charge transfer estimate of each first lightning event using field measurements of each first lightning event from the one or more arrays of electromagnetic field sensors; and associating the one or more first measurements with the first charge transfer estimate in a training data entry of a plurality of training data entries, the plurality of training data entries corresponding to the plurality of first lightning events. The operations may also include training a machine learning model using the plurality of training data entries. The operations may further include receiving one or more second measurements of a second lightning event from the one or more space-based lightning detection sensors without receiving any outputs from the one or more arrays of electromagnetic field sensors. The operations may include processing the one or more second measurements using the machine learning model to obtain a second charge transfer estimate.

These example embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Figure 1A:
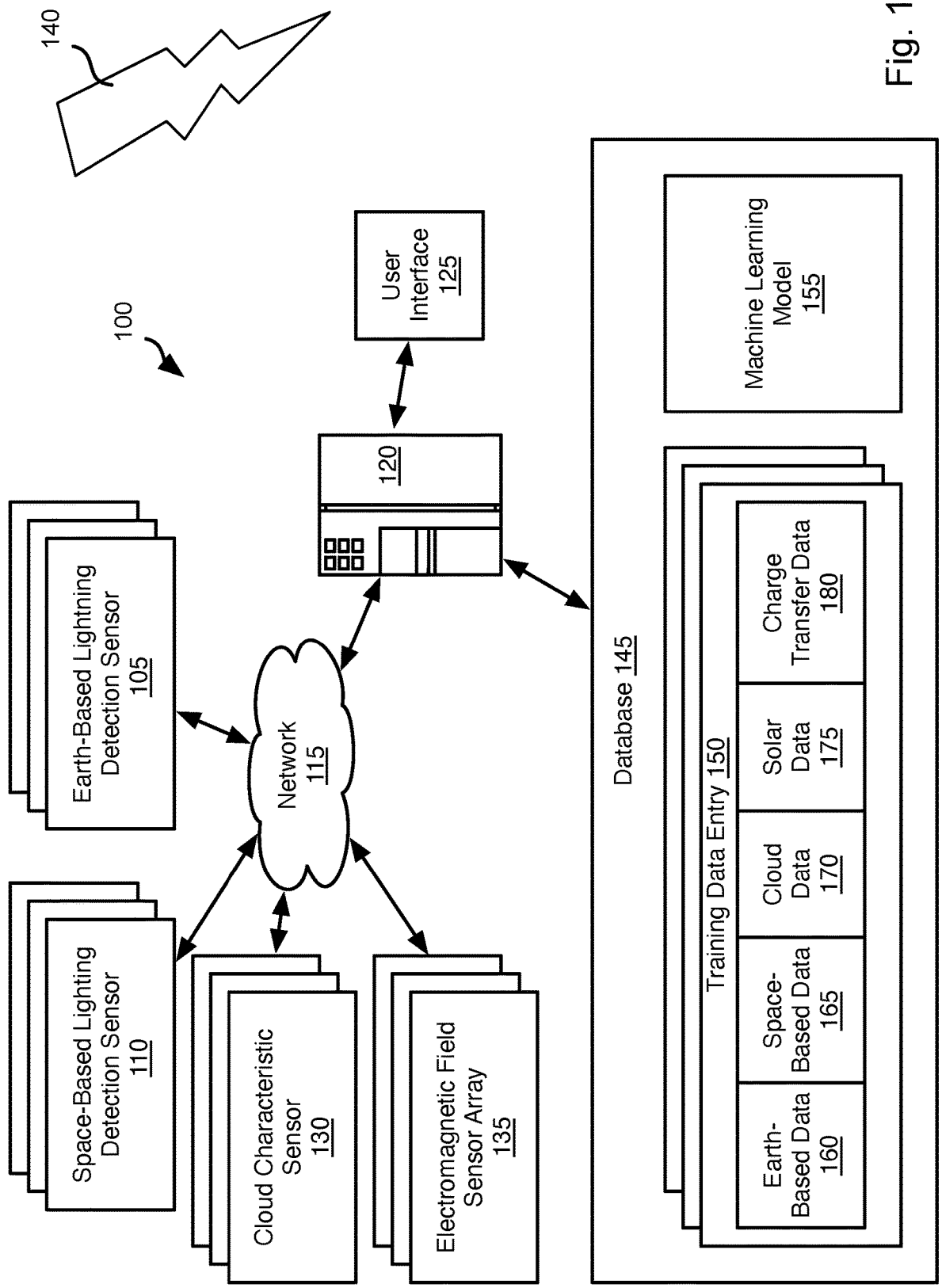
FIG. 1A is an example lightning charge transfer quantification system.

Systems and methods are disclosed to quantify the charge transfer of CG strokes that include and/or are followed by CC. The charge transfer during the CC portion of such CG strokes is of particular interest, though charge transfer throughout a lightning event may be quantified in some embodiments. Such systems and methods may, in effect, use observations of a CG stroke including a combination of optical data and/or other data from space-based lightning detection sensors and data from ground-based lightning detection sensors as an input to a machine learning model that outputs a corresponding estimate of charge transfer during the CG stroke. The machine learning model may be trained using training data entries that include combined space-based and ground-based observations of a CG stroke as an input and a desired output that includes an estimated charge transfer determined using electric field measurements for the CG stroke obtained using one or more arrays of electromagnetic field sensors. Each electromagnetic field sensor may include an electric field sensor, a magnetic field sensor, or both an electric and a magnetic field sensor and may be configured to detect electric fields, magnetic fields, or both electric and magnetic fields.

CG strokes that are followed by CC produce radio frequency (RF) signals at the lower end of the ELF range. CG strokes that are followed by CC also produce light continuously as long as the CC flows. Recently, the U.S. launched the first geostationary satellite ever to include an optical lightning mapping instrument, known as the Geostationary Lightning Mapper (GLM), followed shortly after by a similar Chinese instrument called the Lightning Mapping Imager (LMI). The GLM and other instruments may be housed within one or more of the Geostationary Operational Environmental Satellites (GOES). Over the next several years, the E.U. has plans to put a similar instrument into geostationary orbit. Such space-based lightning detection sensors may provide continuous or nearly continuous observations of light emissions from lightning at time intervals on the order of a couple of milliseconds. Using optical measurements, the nearly continuous light emissions associated with CC may be, to some extent, distinguishable from the mostly impulsive light emissions from CG strokes that do not produce CC, as well as from other in-cloud lightning processes.

Space-based lightning detection sensors, such as GLM, however, may be unable to provide better than about 8-10 kilometer (km) spatial resolution, and thus, the exact location of any given CG stroke is typically not discernible with such instruments. Space-based lightning detection sensors also generally cannot differentiate between CG strokes and in-cloud lightning processes because they may observe diffused optical signals that pass through clouds.

On the other hand, some LLS networks or other earth-based lightning detection systems, such as some from VAISALA, e.g., the U.S. National Lightning Detection Network (NLDN) may be capable of geolocating CG strokes to a spatial accuracy of approximately 100 meters, and can accurately differentiate between CG strokes and in-cloud lightning processes. The Lightning Mapping Array (LMA) is an earth-based detection system that provides high-resolution three-dimensional mapping of in-cloud portions of lightning flashes, including mappings of cloud charge region(s) active during CC events following CG strokes. For purposes of this application, "high-resolution" may be understood to be a resolution of at least 1 cubic kilometer, e.g., each portion of the three dimensional mapping of the cloud charge region corresponds to a volume of 1 cubic kilometer or smaller. The combination of highly precise CG stroke geolocation and accurate differentiation from in-cloud processes available from some earth-based lightning detection systems with extended optical signals detectable from space available from some space-based lightning detection systems as described herein may provide detailed stroke-level information about CC. Such information may then be highly useful in a variety of sectors, such as wildland firefighting, insurance claim investigation, and electric power and telecommunications utility applications.

Effectively, the only way currently available to conclusively identify CG strokes that include and/or are followed by CC is in research projects that do not offer real-time information and have very limited coverage in space and time. High-speed video observations near thunderstorms can clearly distinguish between CG strokes that include and/or are followed by CC and those where CC is absent during and after the CG stroke, but such measurements are always limited to the field of view of the camera and cannot cover areas beyond line of sight, which, in practice, is usually a reduced line of sight due to the precipitation generated by the same thunderstorms. High-speed video observations are normally taken during research campaigns only.

So-called "slow" electric field change observations reach down to near-DC frequencies, where signals due to CC can be detected. Such measurements are frequently taken in conjunction with high-speed video during research projects, but may be independent of video. In any case, the "slow" electric field change observations are designed to look primarily at the electrostatic component of the field changes produced by lightning processes, but the electrostatic component of the field change attenuates very rapidly with distance. Thus, "slow E" change observations are only useful at distances shorter than about 20 km from the lightning. Accordingly, electrostatic fields may only be measured in a limited number of geographic areas where electromagnetic field sensors are present. Neither high-speed video nor "slow E" change observations are suited to wide-area real-time detection of CG strokes that include and/or are followed by CC.

The amount of charge transfer of CG strokes that include and/or are followed by CC may be obtained from observations of electric fields in the vicinity of the CG strokes. An example of an approach for quantifying charge transfer based on electric field measurements is described in C. R. Maggio et al., Estimations of charge transferred and energy released by lightning flashes, Journal of Geophysical Research, 114 (2009), which is hereby incorporated herein by reference in its entirety (hereinafter "Maggio"). In some embodiments, magnetic fields may be measured instead of or in addition to electric fields. For example, the magnetic field may be measured according to U.S. Patent Application Publication 2008/0122424 A1 of Zhang et al. (hereinafter "Zhang1"), which is hereby incorporated herein by reference in its entirety. In some embodiments, measured magnetic fields may be used to directly estimate the charge transfer without relating the measured magnetic fields to estimates of electric fields. For example, the measured magnetic fields may be integrated over time to determine or estimate the charge transfer. This may be helpful when measuring magnetic fields in the near-field range (e.g., less than one wavelength away from the source of the fields).

The combination of continuous optical data from one or more satellite-borne sensors in geostationary orbit with high-precision ground-based identification and geo-location of CG strokes as described herein may be leveraged to identify CG strokes that include and/or are followed by CC over large areas and in real time.

The combination of space-based and ground-based observations for a CG stroke may be further combined with quantification of charge transfer of the CG stroke based on measured electromagnetic fields to train a machine learning model to relate ground-based and space-based observations to the amount of charge transfer of CG strokes in regions where electromagnetic field sensors are not present.

Reference will now be made to the drawings to describe various aspects of some example embodiments of the disclosure. The drawings are diagrammatic and schematic representations of such example embodiments, and are not limiting of the present disclosure, nor are they necessarily drawn to scale.

FIG. 1A is an example lightning charge transfer quantification system 100 (hereinafter "system 100"), arranged in accordance with at least one embodiment described herein. In general, the system 100 may include one or more earth-based lightning detection sensors and one or more space-based lightning detection sensors. For example, the system 100 may include one or more earth-based lightning detection sensors 105. In these and other embodiments, the system 100 may also include one or more space-based lightning detection sensors 110. In an example, the system 100 may include at least two earth-based lightning detection sensors 105 and at least one space-based lightning detection sensor 110. In another example, the system 100 may include three or more earth-based lightning detection sensors 105 and/or two or more space-based lightning detection sensors 110.

The system 100 may also include a network 115, a server 120, one or more user interface devices 125, and/or one or more cloud characteristic sensors 130. In some embodiments, a cloud characteristic sensor 130 may include a satellite-based observation platform such as the Advanced Baseline Imager (ABI), which may be implemented as an instrument housed in one of the satellites of the GOES or other satellites.

The system 100 may further include one or more electromagnetic field sensor arrays 135 (hereinafter "one or more arrays 135"). The electromagnetic field sensors of each of the one or more arrays 135 may be so called "slow" electric field change stations and may be embodied as the electric field sensor 240 described below with respect to FIG. 2B. In other embodiments, the arrays 135 may additionally or alternatively include magnetic field sensors, e.g., to implement the approach described in Zhang1. An "electromagnetic field sensor" as used herein may refer to a "near DC" electromagnetic field sensor, e.g. an electromagnetic field sensor that can sense changes in electrical and/or magnetic fields at frequencies slower than 300 Hz.

Although illustrated as discrete blocks, various blocks may be divided into additional blocks, combined into fewer blocks, or eliminated, depending on the desired implementation.

Each of the one or more earth-based lightning detection sensors 105 may include any type of earth-based lightning detection sensor such as, for example, a VAISALA LS7002 lightning detection sensor or other suitable lightning detection sensor. In some embodiments, one or more of the earth-based lightning detection sensors 105 may include the earth-based lightning detection sensor 200 of FIG. 2A. In these and other embodiments, one or more of the earth-based lightning detection sensors 105 may include one or more components of the earth-based lightning detection sensor 200 of FIG. 2A. In some embodiments, the one or more arrays 135 may include the electric field sensor 240 of FIG. 2B. In these and other embodiments, the electric field sensors of the one or more arrays 135 may include one or more components of the electric field sensor 240 of FIG. 2B.

The one or more earth-based lightning detection sensors 105 may be distributed throughout an environmental space to generate earth-based lightning data about one or more lightning sources 140 within the environmental space. In some embodiments, for example, the one or more earth-based lightning detection sensors 105 may generate the earth-based lightning data about the lightning source 140 by detecting lightning pulses emitted by the lightning sources 140 within the environmental space. A single lightning source 140 is depicted in FIG. 1A for simplicity.

The one or more space-based lightning detection sensors 110 may include any type of space-based lightning detection sensor such as, for example, the GLM, LMI, or any other optical sensor in geostationary orbit, or other suitable space-based lightning detection sensor. The space-based lightning detection sensor 110 may generate space-based lightning data about the lightning sources 140 within the environmental space. In some embodiments, for example, the space-based lightning detection sensor 110 may generate the space-based lightning data about the lightning source 140 by detecting optical signals emitted by the lightning sources 140 within the environmental space.

Each lightning source 140 may include a discharge with movement of charge in the earth's atmosphere or between the atmosphere and earth, and which generates or emits electromagnetic field (EMF) emissions that may be detected by the one or more earth-based lightning detection sensors 105 and/or the one or more space-based lightning detection sensor 110. The EMF emissions may include one or both of RF emissions and optical emissions. RF emissions may generally include EMF emissions with a frequency somewhere in a range from about 0.5 kilohertz (kHz) to about 300 gigahertz (GHz). RF emissions from a lightning source may be referred to as lightning pulses. Optical emissions may generally include EMF emissions in the near-infrared and/or visible spectrum (about 200-750 terahertz (THZ) or 400-1500 nanometers (nm)). In an example embodiment, the optical emissions detected by the one or more space-based lightning detection sensors 110 may more particularly include EMF emissions with a wavelength of, e.g., 777.4 nm. In other embodiments, the optical emissions detected by the one or more space-based lightning detection sensors 110 may include other and/or additional wavelengths. Optical emissions from a lightning source may be referred to as optical signals.

Each of the lightning sources 140 may include a cloud-to-ground (CG) lightning discharge, or an in-cloud (IC) lightning discharge. A CG lightning discharge may include an electrical discharge between a cloud and the ground. An IC lightning discharge may include an electrical discharge within a cloud, referred to as an intracloud lightning discharge, an electrical discharge between two clouds, referred to as a cloud-to-cloud lightning discharge, or an electrical discharge between a cloud and the air, referred to as a cloud-to-air lightning discharge. The lightning pulses emitted by CG lightning discharges may be referred to as CG return strokes, or simply CG strokes. The lightning pulses emitted by IC lightning discharges that do not reach ground may be referred to as cloud pulses.

Accordingly, each lightning source 140 may emit a lightning pulse, multiple lightning pulses, an optical signal, multiple optical signals, and/or other lightning emissions that may be detected by the one or more earth-based lightning detection sensors 105 and/or the one or more space-based lightning detection sensor 110. In general, a lightning pulse may have a duration on the order of a few microseconds (μs) or more, depending on how "pulse" is defined. The lightning pulses in the lightning data generated by the one or more earth-based lightning detection sensors 105 may be grouped into lightning flashes using any suitable algorithm, such as the algorithm described in M. J. Murphy et al., Cloud Lightning Performance and Climatology of the U.S. Based on the Upgraded U.S. National Lightning Detection Network, Seventh Conf. on Meteorological Applications of Lightning Data, Amer. Meteorol. Soc. (2015), which is herein incorporated by reference in its entirety. A lightning flash may have a duration of, e.g., a hundred milliseconds (ms) or more and may be made up of multiple lightning pulses. Additionally or alternatively, the optical signals detected from space may be grouped into lightning flashes using any suitable algorithm, such as the algorithm described in D. Mach, et al., Performance assessment of the optical transient detector and lightning imaging sensor, Journal of Geophysical Research, (2007), which is herein incorporated by reference in its entirety.

In some embodiments, the optical emission of a lightning pulse may be represented by an optical "group", where a "group" consists of adjacent pixels of captured images of the lighting flash that are all illuminated within a single measurement time frame, e.g. single image. An optical emission may include a set of optical groups identified for a set of consecutively captured images captured within a time window (e.g., from 8 to 20 ms, 8 to 100 ms, 8 to 250 ms, 8 to 500 ms, or other window) and having similarly positioned optical groups, e.g. at least partially overlapping pixel positions within the images. An approach to defining an optical emission based on optical groups is described in Bitzer, Global distribution and properties of continuing current in lightning, Journal of Geophysical Research, 122 (2017) (hereinafter "Bitzer"), which is incorporated herein by reference in its entirety. Characteristics of an optical emission may be obtained from these sets of optical groups and may include its duration, the maximum intensity of any optical group within the optical emission, the sum of intensities of all groups making up the emission, the maximum area covered by any group making up the emission, or the sum of all areas of all groups making up the emission.

Lightning pulses may each have a type. For instance, the type of each lightning pulse may be a cloud pulse or a CG stroke. Any lightning pulse emitted by a lightning discharge that does not reach the ground may be categorized as a cloud pulse. Any lightning pulse emitted by a lightning discharge that reaches the ground may be categorized as a CG stroke. The type of each of the lightning pulses may be determined from the earth-based lightning data generated by the one or more earth-based lightning detection sensors 105 responsive to detecting the lightning pulses. For instance, a shape of a plot of a time-varying voltage detected for a lightning pulse, or other information in or derived from earth-based lightning data generated for the lightning pulse, may be used to determine the type of each lightning pulse.

Some lightning pulses emitted by lightning sources 140 as CG strokes may include or be followed by continuing current (CC). CC may include an electrical current that flows from the cloud to the ground for a period of time due to the CG stroke. For example, CC may flow between the cloud and the ground for a period of time equal to or greater than 10 milliseconds (ms). Additionally or alternatively, CC that is included in or follows a return stroke may include low current values. In some embodiments, CC may include between ten and several hundred amperes. Furthermore, CC may flow for ten to several hundred milliseconds. Continuing current may remove charge from a region within the cloud, whereas return stroke current (e.g., the current that flows during the return stroke) may be impulsive, usually lasting less than three milliseconds, and may remove charge deposited by a preceding return stroke leader.

Return stroke current typically poses less of a risk for damage through heating metal elements than continuing current. The energy delivered to a good conductor is proportional to the total charge transferred, which is typically higher in continuing currents than return stroke currents. In some embodiments, return stroke current may transfer a charge comparable to a charge of continuing current. In the cases of strikes to metal, return stroke current with comparable charge transfer may still be less destructive than continuing currents, since the short durations limit the heat penetration. Nevertheless, a total charge transferred by a return stroke current may be a useful parameter in some scientific applications, including sprite production (Cummer, S. A., & Lyons, W. A. (2004). Lightning charge moment changes in US High Plains thunderstorms. Geophysical research letters, 31(5)) and lightning flash morphology (Lu, G., Cummer, S. A., Blakeslee, R. J., Weiss, S., & Beasley, W. H. (2012). Lightning morphology and impulse charge moment change of high peak current negative strokes. Journal of Geophysical Research: Atmospheres, 117(D4)).

In some embodiments, the one or more earth-based lightning detection sensors 105 may detect low frequency lightning pulses emitted by the lightning sources 140. For example, the one or more earth-based lightning detection sensors 105 may detect the lightning pulses at frequencies between thirty kHz and three hundred kHz. Additionally or alternatively, the one or more earth-based lightning detection sensors 105 may detect the lightning pulses at frequencies equal to or less than thirty kHz. Additionally or alternatively, the one or more earth-based lightning detection sensors 105 may detect the lightning pulses at frequencies equal to or greater than three hundred kHz.

In some embodiments, one or more of the one or more earth-based lightning detection sensors 105 may detect time domain, low frequency lightning pulses that may have (and/or whose data may have), for example, a specific shape, a specific time of arrival, and/or a specific direction of arrival from the one or more lightning sources 140.

In some embodiments, the one or more earth-based lightning detection sensors 105 may generate the earth-based lightning data for detected lightning pulses. The earth-based lightning data, for example, may include time-varying voltage, current, or other time-varying properties of the detected lightning pulses. For any of these time-varying properties of a lightning pulse, data may be derived therefrom such as times of occurrence of the lightning pulses, durations of the lightning pulses, the timing of when the lightning pulses are detected, the magnitude of the lightning pulses, peak amplitude, time from threshold crossing to peak amplitude, time from peak amplitude to zero (or below threshold) amplitude, peak current, and the polarity of the lightning pulses. Other data obtained from the one or more earth-based sensors 105 may include the type of lightning pulses, global positioning system (GPS) data associated with the one or more earth-based lightning detection sensors 105 that detected the lightning pulses, angle or direction of arrival data, data from which one or more of the foregoing may be determined or derived, or other earth-based lightning data.

Other information that may be derived from data received from the one or more earth-based lightning detection sensors 105 may include the presence of any in-cloud discharge activity detectable by the one or more earth-based lightning detection sensors 105 following the CG stroke, and/or the horizontal extent and/or magnitude and duration of any such in-cloud activity. Likewise, characteristics of in-cloud discharge activity may be determined, such as the peak amplitude, time from threshold crossing to peak amplitude, time from peak amplitude to zero (or below threshold) amplitude, and an estimate of peak current.

In some embodiments, the one or more earth-based lightning detection sensors 105 may include a camera configured to capture video data of detected lightning pulses. In some embodiments, locations of detected lightning pulses included in or derived from the earth-based lightning data may have a spatial resolution of about 100 meters, or more or less than 100 meters.

In some embodiments, the one or more earth-based lightning detection sensors 105 may detect lightning sources 140 and/or lightning pulses emitted by the lightning sources 140 at long ranges such as, for example, ranges greater than 500 km, 1000 km, 1500 km, 1750 km, etc.

In some embodiments, the one or more space-based lightning detection sensor 110 may detect the lightning sources 140 and/or optical signals emitted by the lightning sources 140 and received by the one or more space-based lightning detection sensors 110. Specifically, in some embodiments, the one or more space-based lightning detection sensors 110 may measure the optical signals from lightning sources 140 by looking down at cloud tops. The optical signals may contain no information that can be used to discern the lightning type or polarity on a pulse-by-pulse basis. In these and other embodiments, the one or more space-based lightning detection sensors 110 may generate the space-based lightning data for detected optical signals.

The space-based lightning data, for example, may include, times of occurrence of the optical signals, locations of the optical signals, durations of the optical signals, timing of when the optical signals are detected, intensity of the light emitted by the detected optical signals, the areal extent of the detected optical signals, data from which one or more of the foregoing may be determined or derived, grouping according to optical signals, or other space-based lightning data. Alternatively or additionally, the space-based lightning data may include geolocation data for detected optical signals (or more particularly their location of origin), or geolocation data for detected optical signals may be derived from the space-based lightning data. In some embodiments, locations of detected optical signals included in or derived from the space-based lightning data may have a spatial resolution of about 8-10 km, or more than 10 km or less than 8 km.

In some embodiments, the one or more earth-based lightning detection sensors 105 may provide geolocation capabilities to the server 120 via the network 115 that specify the geolocation of the respective earth-based lightning detection sensors 105.

Each of the one or more arrays 135 may include two or more, such as three or more, electromagnetic field sensors. For example, an electromagnetic field sensor may be embodied as a ground-mounted rotating shutter electric field mill ("E mill"), such as the electric field sensor 240 shown in FIG. 2B. Each of the arrays 135 may additionally or alternatively include electromagnetic field sensors mounted to weather balloons released in the vicinity of a storm. The manner in which the electromagnetic field sensors are deployed and data captured therefrom is used may be as described in Maggio. In some embodiments, the electromagnetic field sensors of an individual one of the one or more arrays 135 are separated from one another by a distance less than or equal to the useful range of each electromagnetic field sensor, such as about 20 km. In some embodiments, the electromagnetic field sensors of each of the one or more arrays 135 are arranged in a non-colinear fashion.

The electromagnetic field sensors of the one or more arrays 135 may incorporate geolocation devices, such as GPS receivers, radiosondes, or other device enabling a component of the electromagnetic field sensor to determine its position or an external device to detect the position of the electromagnetic field sensor. The electromagnetic field sensors of each of the one or more arrays 135 may include components enabling communication with the network 115 or may transmit data to a communication device that is coupled to the network 115 and transmits data collected by the one or more arrays 135 over the network 115.

In some embodiments, the network 115 may connect the one or more earth-based lightning detection sensors 105, the one or more space-based lightning detection sensors 110, one or more cloud characteristic sensors 130, and the one or more arrays 135 to the server 120. In some embodiments, all or some of the earth-based lightning detection sensors 105, the one or more space-based lightning detection sensors 110, one or more cloud characteristic sensors 130, and the one or more arrays 135 communicate indirectly with the server system 120, such as by way of an intermediate server system that collects data describing lightning events. The data may then be retrieved from the intermediate server by the server system 120. In some embodiments, the network 115 may be a wireless network that includes one or more wireless networks, such as, for example a wireless local area network (LAN), a cellular network, a long-term evolution (LTE) network, a code division multiple access (CDMA) network, a global system for mobile communication (GSM) network, a microwave network, a long range Wi-Fi network, a satellite network, or other suitable network. In some embodiments, the network 115 may include a wired LAN or Ethernet connection, or other wired connections for serial or parallel data transmission from the one or more earth-based lightning detection sensors 105 and one or more arrays 135 to the server 120. In some embodiments, the network 115 may include both wireless and wired components. For example, the one or more space-based lightning detection sensors 110 and/or the one or more cloud characteristic sensors 130 may be communicatively coupled to the network 115 via one or more wireless connections and the one or more earth-based lightning detection sensors 105, one or more arrays 135, and the server 120 may be communicatively coupled to the network 115 via one or more wired connections.

Figure 4:
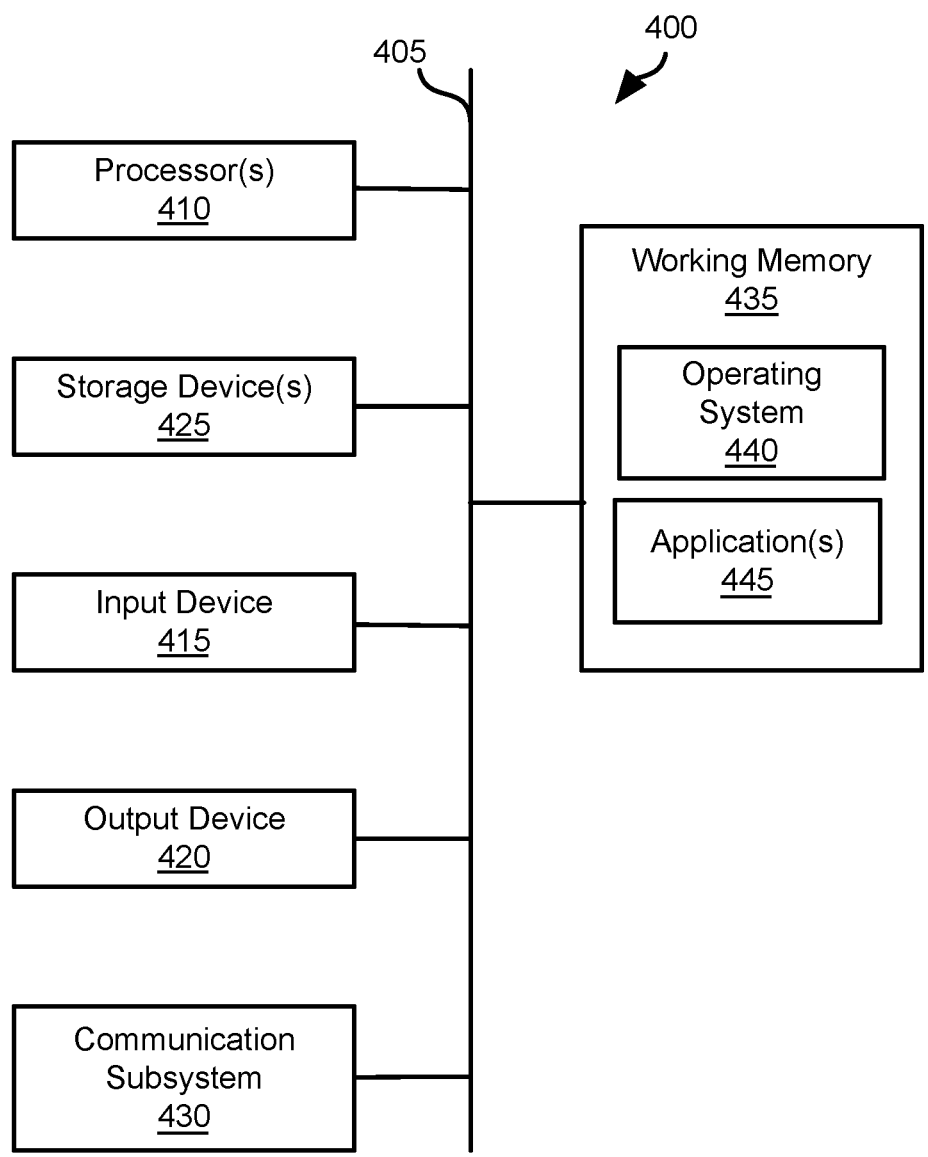
FIG. 4 shows an example computational system, all arranged in accordance with at least one embodiment described herein.

In some embodiments, the server 120 may include one or more components of computational system 400 of FIG. 4. In some embodiments, the server 120 may include one or more servers located in one or more locations and/or located at various distributed locations (e.g., a cloud server).

In some embodiments, the server 120 may receive the earth-based lightning data from all or some of the one or more earth-based lightning detection sensors 105 and electromagnetic field data from the one or more arrays 135 via the network 115. In these and other embodiments, the server 120 may also receive the space-based lightning data from the one or more space-based lightning detection sensors 110 via the network 115. In some embodiments, the server 120 may also receive cloud characteristics data from the one or more cloud characteristic sensors 130 via the network 115. In some embodiments, the server 120 may include or access a database 145 where the earth-based lightning data received from the one or more earth-based lightning detection sensors 105, electromagnetic field data received from the one or more arrays 135, the space-based lightning data received from the one or more space-based lightning detection sensors 110, and/or the cloud characteristics data from the one or more cloud characteristic sensors 130 may be stored.

In some embodiments, the server 120 may include a processor (or one or more processors) programmed to process and/or analyze the earth-based lightning data received from the one or more earth-based lightning detection sensors 105, and/or the space-based lightning data received from the one or more space-based lightning detection sensor 110, and/or cloud characteristics data from the one or more cloud characteristic sensors 130 that may be stored in the database 145 of the server 120.

In some embodiments, the server 120 may geolocate (e.g., determine a position of) the lightning sources 140, or locations of origin of the corresponding lightning pulses, based on the one or more earth-based lightning data received from the earth-based lightning detection sensors 105. For example, the server 120 may be configured to determine a position of the lightning sources 140, e.g., using a time difference of arrival (TDOA) or triangulation method based on GPS or other position data and timing data included in the earth-based lightning data received from the one or more earth-based lightning detection sensors 105. Such methods may consider the time of arrival of the same lightning pulse emitted by the lightning source 140 at two (or more) earth-based lightning detection sensors 105, locations, and/or angle/direction data. Alternatively or additionally, the server 120 may determine a time of occurrence of the lightning sources 140, or times of occurrence of the corresponding lightning pulses and/or corresponding optical signals, based on the earth-based lightning data received from the one or more earth-based lightning detection sensors 105 and/or based on the space-based lightning data received from the space-based lightning detection sensor 110.

In some embodiments, the server 120 may determine whether multiple optical signals detected by one space-based lightning detection sensor 110 are part of a contiguous group. Specifically, the server 120 may determine whether multiple optical signals detected by the space-based lightning detection sensor 110 occurred with time gaps between each of the optical signals that are equal to or less than a threshold time limit. In some embodiments, the threshold time limit may be equal to or less than 2 ms. In other embodiments, the threshold time limit may be greater than 2 ms. Additionally or alternatively, the server 120 may determine whether the multiple optical signals detected by the space-based lightning detection sensor 110 occurred within a distance of each other that is equal to or less than a threshold distance limit. In some embodiments, the threshold distance limit may be equal to or less than 20 km. In other embodiments, the threshold distance limit may be more than 20 km.

In an example, one of the one or more space-based lightning detection sensors 110 may detect a first optical signal, a second optical signal, and a third optical signal. The first optical signal may be detected and assigned a first time value and a first location, the second optical signal may be detected and assigned a second time value and a second location. If the difference between the first time value and the second time value is equal to or less than the threshold time limit and the distance between the first location and the second location is equal to or less than the threshold distance limit, the server 120 may determine that the first optical signal and the second optical signal are part of a contiguous group. Additionally, the third optical signal may be detected and assigned a third time value and a third location, and if the difference between the third time value and at least one of the first time value or the second time value is also less than or equal to the threshold time limit and the distance between the third location and at least one of the first location or the second location is less than or equal to the threshold distance limit, the server 120 may determine that the first optical signal, the second optical signal, and the third optical signal are all part of a contiguous group. Alternatively, if the differences between the third time value and each of the first time value and the second time value are greater than the threshold time limit and/or the distances between the third location and each of the first location and the second location are greater than the threshold distance limit, the server 120 may determine that the third optical signal is not a part of the contiguous group. The server 120 may generate data indicating which optical signals detected by the space-based lightning detection sensor 110 are part of contiguous groups in the space-based lightning data.

In some embodiments, the server 120 may be configured to determine which lightning pulses are CG strokes and which are cloud pulses based on the earth-based lightning data. For instance, a shape of a plot of a time-varying voltage detected for a lightning pulse, or other information in or derived from earth-based lightning data generated for the lightning pulse, may be used by the server 120 to determine the type of each lightning pulse, e.g., whether each lightning pulse is a CG stroke or a cloud pulse.

In these and other embodiments, and for those lightning pulses determined to be CG strokes from the earth-based lightning data, the server 120 may be configured to determine if each of the CG strokes includes or is followed by CC based on the space-based lightning data. For example, the server 120 may determine whether contiguous groups having a time duration have been detected by the space-based lightning detection sensor 110 and if the time duration exceeds a time duration threshold. The time duration may be determined starting from a time assigned to a CG stroke. For example, a CG stroke may be determined to include or be followed by CC if a contiguous group of optical signals associated (or correlated) with the CG stroke is observed that has a duration of at least 8 ms starting from the time assigned to the CG stroke. In other embodiments, the time duration threshold may be greater or less than 8 ms. Additionally or alternatively, the server 120 may determine that a CG stroke includes or is followed by CC if a contiguous group of optical signals associated (or correlated) with the CG stroke includes at least one optical signal within the time duration following the CG stroke with an intensity that exceeds a threshold intensity. For example, a CG stroke may be determined to include or be followed by CC if the corresponding intensity is greater than or equal to 10-15 J. In other embodiments, the intensity threshold may be greater or less than 10-15 J. The time assigned to any given CG stroke may include the time of occurrence of the CG stroke, which may be included in or derived from the earth-based lightning data received from the one or more earth-based lightning detection sensors 105.

In some embodiments, the server 120 may determine that a CG stroke includes or is followed by CC if a sum of the intensity of multiple detected optical signals within a contiguous group associated (or correlated) with the CG stroke starting from the time assigned to the CG stroke exceeds an intensity sum threshold. For example, if the sum of the intensity of the detected optical signals in the contiguous group is greater than or equal to 10-14 J, the server 120 may determine that the CG stroke includes or is followed by CC. In other embodiments, the intensity sum threshold may be greater or less than 10-14 J. Additionally or alternatively, the CG stroke may be determined to include or be followed by CC if both the corresponding intensity exceeds the threshold intensity and the corresponding time duration exceeds the threshold duration.

Additionally or alternatively, the server 120 may determine that a CG stroke includes or is followed by CC if an areal extent of any of the detected optical signals within a contiguous group associated (or correlated) with the CG stroke starting from the time assigned to the CG stroke exceeds an areal threshold. For example, the CG stroke may be determined to include or be followed by CC if the corresponding areal extent of any of the detected optical signals in the contiguous group is equal to or greater than 200 km2. In other embodiments, the areal threshold may be greater than or less than 200 km2.

Additionally or alternatively, the server 120 may determine that a CG stroke includes or is followed by CC if a sum of the areal extents of detected optical signals within a contiguous group associated (or correlated) with the CG stroke starting from the time assigned to the CG stroke exceeds an areal sum threshold. For example, if the sum of the corresponding areal extents is equal to or exceeds 1000 km2, the CG stroke may be determined to include or be followed by CC. In other embodiments, the areal sum threshold may be greater than or less than 1000 km2.

Additionally or alternatively, the server 120 may determine that a CG stroke includes or is followed by CC if any two or more thresholds are exceeded based on time duration, intensity of one or more detected optical signals, sum of intensity of the detected optical signals, areal extent of one or more detected optical signals, or sum of areal extents of the detected optical signals, observed within a contiguous group associated (or correlated) with the CG stroke starting from the time assigned to the CG stroke. In these and other embodiments, the server 120 may execute, perform, or control performance of one or more of the methods or operations described herein.

In some embodiments, the earth-based lightning data may include cloud pulses detected during a period of time following a CG stroke. In some embodiments, the earth-based lightning data may include estimates of altitude of detected cloud pulses. In some embodiments, the server 120 may determine that a CG stroke includes or is followed by CC on the basis of the number, timing, two-dimensional positions, and/or altitude of one or more cloud pulses detected by the one or more earth-based lightning detection sensor 105 in addition to the space-based lightning data.

In some embodiments, additional space-based data relating to the characteristics of clouds that produce the CG stroke may be available. Such cloud characteristics may include a cloud top altitude, a cloud top temperature, a cloud amount, a cloud optical depth, a cloud area colder than a temperature threshold, and whether the cloud top consists primarily of ice crystals or supercooled liquid water droplets. Such space-based cloud characteristics data may be generated by, e.g., one or more of the cloud characteristic sensors 130 of FIG. 1. In some embodiments, the cloud characteristics may be obtained from the one or more cloud characteristic sensors 130 using raw data such as radiance and/or brightness temperature observations as measured within one or more channels (one or more visible light channels, one or more near infrared channels, one or more infrared channels, etc.). In some embodiments, the raw data may be used in addition to, or in place of, the cloud characteristics derived from the raw data to characterize properties of a CG stroke according to the methods described herein.

In some embodiments, thresholds on the optical signal information detected by the one or more space-based lightning detection sensors 110 may be adjusted dynamically based on one or more of the cloud characteristics. For example, the intensity of one or more optical signals within a contiguous group associated (or correlated) with a CG stroke starting from the time assigned to the CG stroke may need to exceed a first intensity threshold of 10-15 J if the cloud top altitude is determined to be at or below a first cloud top altitude threshold and the cloud top is determined to be composed primarily of supercooled liquid water droplets. In some embodiments, the first cloud top altitude threshold may be equal to or less than five km. In other embodiments, the first cloud top altitude threshold may be greater than five km. In other embodiments, the first intensity threshold may be less than or greater than 10-15 J. As another example, the intensity of one or more optical signals may need to exceed a different second intensity threshold of 10-14 J if the cloud top altitude is determined to be at or above a second cloud top altitude threshold and the cloud top is determined to be composed primarily of ice crystals. In some embodiments, the second cloud top altitude threshold may be equal to or greater than ten km. In other embodiments, the second cloud top altitude threshold may be less than ten km. In other embodiments, the second intensity threshold may be less than or greater than 10-14 J.

In some embodiments, the user interface device 125 may include any device that can access data stored at the server 120 such as, for example, a computer, a laptop, a smartphone, a tablet, or other suitable device. In some embodiments, the user interface device 125 may be used to retrieve and/or present the earth-based lightning data from the one or more earth-based lightning detection sensors 105, the electromagnetic field data received from the one or more arrays 135, the space-based lightning data from the one or more space-based lightning detection sensor 110, data that identifies which CG strokes include and/or are followed by CC, or other measurements and information related to the lightning sources 140, lightning pulses, and/or optical signals to a user.

In some embodiments, the one or more cloud characteristic sensors 130 may be configured to detect clouds in the environmental space and/or characteristics of the clouds in the environmental space. The one or more cloud characteristic sensors 130 may be a space-based sensor (e.g., on a satellite in orbit around the Earth) and may optionally be co-located with the one or more space-based lightning detection sensors 110. In other embodiments, the cloud characteristic sensor 130 may be an earth-based sensor. The one or more cloud characteristic sensors 130 may output a raw sensor feed to the server 120 which may generate cloud characteristics data from the raw sensor feed. Alternatively or additionally, the one or more cloud characteristic sensors 130 may generate the cloud characteristics data and then send it to the server 120. The cloud characteristics data may include, for a given cloud, one or more of a cloud top altitude, a cloud top temperature, a cloud amount, and whether the cloud top consists primarily of ice crystals or supercooled liquid water droplets.

In some embodiments, the server 120 stores training data entries 150 in the database 145 that may be used to train a machine learning model 155 to quantify the charge transfer of a CG stroke that includes or is followed by CC. In particular, a training data entry 150 may be created in response to each detection of a CG stroke according to the approach described herein or only in response to each detection of a CG stroke determined to include or be followed by CC according to the methods described herein. Each training data entry 150 may include data relating to a CG stroke observed using all or some of the one or more earth-based lightning detection sensors 105, the one or more space-based lightning detection sensors 110, the one or more arrays 135, and the one or more cloud characteristic sensors 130.

Accordingly, each training data entry 150 may include earth-based lightning data 160 that includes, or is derived from, observations of the CG stroke obtained from the one or more earth-based lightning detection sensors 105. As discussed above, an observation of a CG stroke may include data representing detected electromagnetic lightning pulses emitted by the CG stroke and detected by the one or more earth-based lightning detection sensors 105. For example, this may include detecting electromagnetic waves in the range of 30 to 300 kHz or at frequencies above or below this range. The data representing lightning pulses may include samples of detected electromagnetic waves in the time domain, a frequency domain representation of the signals (e.g., Fourier transform), statistical data (maximum amplitude, pulse duration above a threshold amplitude, etc.), a shape of the lightning pulse (e.g., a Gaussian curve fit, polynomial curve fit, or other representation of shape), a time of arrival of the lightning pulse (e.g., time of detection of peak amplitude or of amplitude exceeding a threshold), or other data describing the lightning pulse.

Other data describing a CG stroke that may be captured using the one or more earth-based lightning detection sensors 105 and included in the earth-based lightning data 160 may include measurements of a time varying voltage, polarity of the lightning pulse of the CG stroke, a type of the lightning pulse, a GPS coordinate of the detecting earth-based lightning detection sensor 105, and an angle or direction of arrival of the lightning pulse at the earth-based lightning detection sensor 105. The earth-based lightning data 160 may further include data derived from the observations of the one or more earth-based lightning detection sensors 105, such as a peak current of a CG stroke, the presence of any in-cloud discharge activity detectable by the one or more earth-based lightning detection sensors 105 following the CG stroke, and/or the horizontal extent and/or magnitude and duration of any such in-cloud activity.

As discussed above, an earth-based observation of a CG stroke may include optical observations, e.g. images, of optical emissions of the CG stroke. Accordingly, the training data entry 150 corresponding to the CG stroke may further include still images or video data capturing optical emissions of the CG stroke as captured using a camera of the one or more earth-based lightning detection sensors 105.

The training data entry 150 for each CG stroke may further include space-based lightning data 165. The space-based lightning data 165 may include data describing a CG stroke as obtained from the one or more space-based lightning detection sensors. Such data may include a set of images captured while looking down at cloud tops and captured during occurrence of the CG stroke. The space-based lightning data 165 may include data obtained by processing these images. For example, the areal extent of the optical emissions of the CG stroke, the intensity (e.g., average or peak intensity) of pixels within this area, the geolocation of the areal extent of the optical emissions (e.g., geolocation of a centroid of the areal extent), time of occurrence of the optical emissions, or other data describing the detected optical emissions of the CG stroke.

As described above, image data may be used to represent an optical emission of the CG stroke. This image data may be incorporated in the space-based lightning data. This image data may include sets of optical groups representing an optical emission as described above and characteristics of an optical emission derived therefrom, which may include all or some of its duration, the maximum intensity of any optical group within the optical emission, the sum of intensities of all groups making up the emission, the maximum area covered by any group making up the emission, or the sum of all areas of all groups making up the emission Where a cloud characteristic sensor 130 is used, the training data entry 150 for each CG stroke may further include cloud characteristic data 170 describing characteristics of clouds that produced the CG stroke. These characteristics may include a cloud top altitude, a cloud top temperature, a cloud optical depth, a cloud area colder than a temperature threshold, a cloud amount, and whether the cloud top consists primarily of ice crystals or supercooled liquid water droplets, and the like. Cloud properties can affect the near-infrared emissions observed from the CG stroke and therefore may be relevant to the charge quantification process described herein.

Inasmuch as all or some of the earth-based lightning data 160, space-based lightning data 165, and cloud characteristic data 170 includes optical data, additional solar illumination data 175 that describes lighting conditions at the time of occurrence of the CG stroke may be either incorporated into the training data entry 150 or used to adjust images used to obtain the earth-based lightning data 160, space-based lightning data 165, and/or cloud characteristic data 170. Such solar illumination data 175 may include a sun angle at the time of occurrence of the CG stroke. The sun angle may be the angle of the sun relative to the geolocation of the CG stroke determined as described above. This angle may be measured by observation, e.g. optically detecting the sun using a camera, measuring the orientation of shadows, detecting a non-illuminated portion of the earth in a satellite image, or other approach. The sun angle may also be determined from the geolocation and time of occurrence of the CG stroke and the known orientation of the earth relative to the sun at the time of occurrence.

Each training data entry 150 may further include charge transfer data 180 obtained from the one or more arrays 135 that captured electromagnetic field data for the CG stroke represented by the training data entry 150. The charge transfer of the CG stroke may be quantified using the approach of Maggio using the captured electric field data, or using any other suitable method. The charge transfer may also or alternatively be obtained directly from captured magnetic field data. In some embodiments, training data entries 150 are added to the set of training data only for CG strokes for which electric field data was captured. In some embodiments, the earth-based data 160 includes measurements from the LMA, or other earth-based lightning sensor 105, that include three-dimensional positions of charge regions at various stages of a lightning flash of the CG stroke. In such instances, the charge transfer of the CG stroke may be determined from these observations and the field measurements from the one or more arrays 135. For example, field measurements from at least three to four electric field sensors within 20 km of the geolocation of the CG stroke may be used along with the three-dimensional mapping of charge regions of the CG stroke to estimate charge transfer according to the approach of Maggio or any other suitable method. In some embodiments, only observations of those CG strokes for which three-dimensional mapping of charge regions are available, such as those observed using LMA, are used to generate training data entries 150. Three-dimensional mapping of charge regions may also be obtained using sensors other than the LMA, such as an array of two-dimensional earth-based lightning detection sensors 105 or an array 135.

In some embodiments, the charge transfer data 180 of a training data entry 150 is obtained from the electromagnetic field data without reference to image data characterizing the optical emissions of the CG stroke.

The charge transfer data 180 represents a desired output such that the machine learning model 155 is trained using the training data entries 150 to output an estimate of charge transfer for a given set of input data including all or some of earth-based lightning data 160, space-based lightning data 165, cloud characteristic data 170, solar illumination data 175, and charge transfer data 180. In this manner, all or some of earth-based lightning data 160, space-based lightning data 165, and cloud characteristic data 170 that represents a CG stroke for which electromagnetic field data was not available may be input to the machine learning model 155 to obtain an estimate of the charge transfer for that CG stroke.

The machine learning model 155 may be a multiple linear regression model, a neural network, a deep neural network, a convolution neural network, a Bayesian machine learning model, a genetic algorithm model, or a model according to any machine learning algorithm known in the art. The machine learning model 155 may be trained using the training data entries 150 according to the algorithm for the type of the machine learning model 155. In an example, a portion, e.g. from 50 to 80 percent of the training data entries 150, is used to train the machine learning model 155 and a remaining portion is used to validate the machine learning model 155.

Figure 1B:
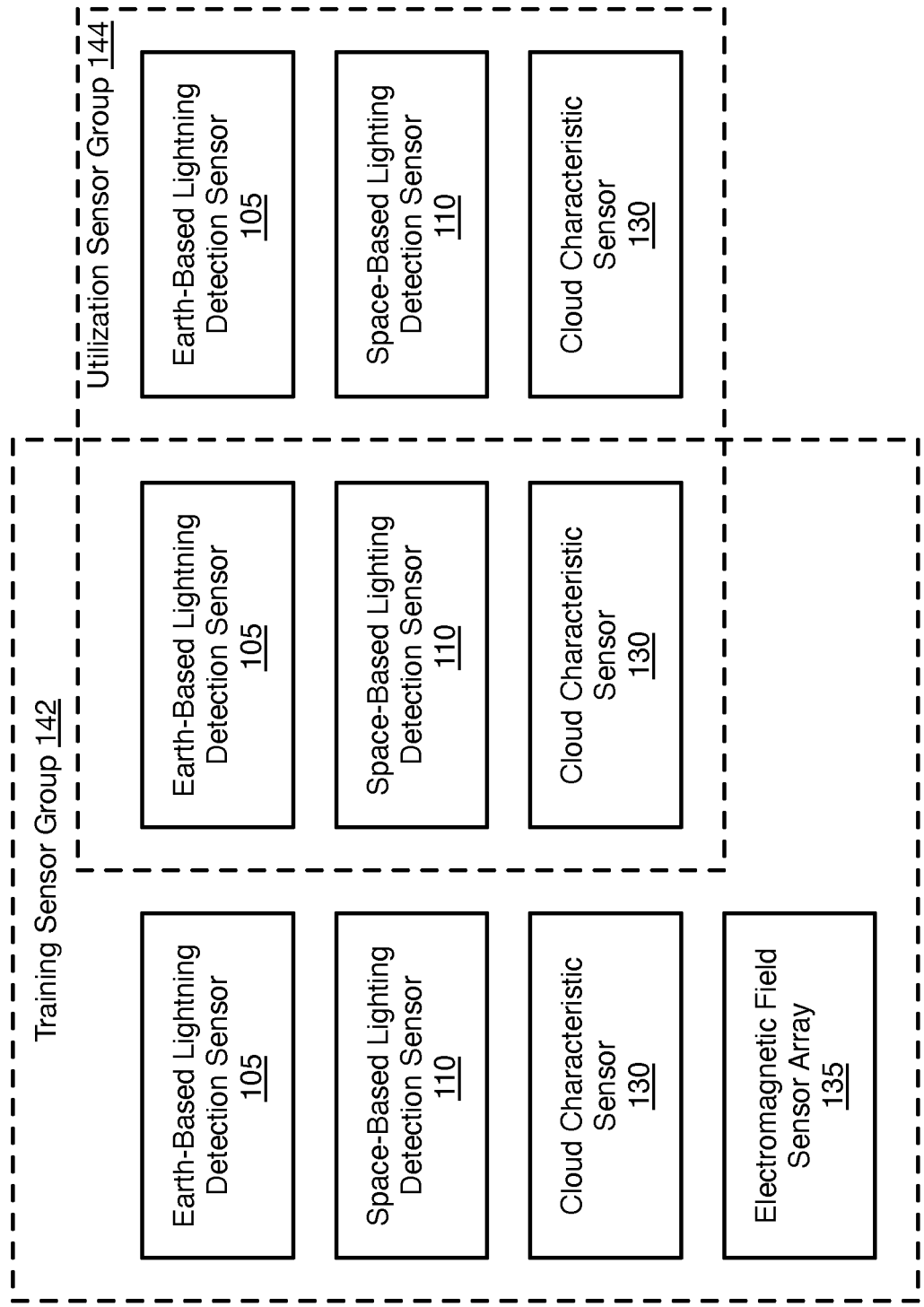
FIG. 1B illustrates example groupings of sensors for training of a model and utilization of a model.

Referring to FIG. 1B, the various sensors 105, 110, 130, 135 of the system 100 may be characterized as belonging to one or more sensor groups 142, 144. A training sensor group 142 generates observations of lightning events that may be used to generate training data entries 150 used to train the machine learning model 155, such as according to the method 300*a* of FIG. 3A described below. A utilization sensor group 144 may generate observations of lightning events that are then processed using the machine learning model 155 to obtain estimates of charge transfer, such as according to the method 300*b* of FIG. 3B.

As is apparent in FIG. 1B, the training sensor group 142 may include one or more earth-based lightning detection sensors 105, one or more space-based lightning detection sensors 110, one or more cloud characteristic sensors 130, and one or more arrays 135. The utilization sensor group 144 may likewise include one or more earth-based lightning detection sensors 105, one or more space-based lightning detection sensors 110, and one or more cloud characteristic sensors 130. As shown in FIG. 1B, there may be some overlap between sensors groups 142, 144 such that a sensor 105, 110, 130 may belong to two groups 142, 144. In some implementations, no overlap occurs. In other implementations, there may be complete overlap: each of the sensors 105, 110, 130 in the training sensor group 142 may also be in the utilization sensor group 144.

In some embodiments, the one-or more earth-based lightning detection sensors 105 in the training sensor group 142 include at least one earth-based lightning detection sensor 105 that provides high-resolution three-dimensional mapping of cloud charge regions during CG strokes that include and/or are followed by CC, which may be the LMA in some embodiments. In other embodiments, a three-dimensional mapping of cloud charge regions for use in generating training data may be generated using a plurality of two-dimensional earth-based lightning detection sensors 105, such as an array of LS7002 sensors from VAISALA. For example, the training sensor group 142 may include an array of 10 or more of such sensors within a radius of 20 km that is sufficiently dense to provide a three-dimensional mapping for use in generating training data. In still other embodiments, a three-dimensional mapping of cloud charge regions may be generated from measurements by an array 135 such that the one or more earth-based lightning detection sensors 105 of the training sensor group 142 may not include those capable of providing high-resolution three-dimensional mapping of cloud charge regions.

In some embodiments, the utilization sensor group 144 lacks earth-based detection sensors 105 capable of providing high-resolution three-dimensional mapping of cloud charge regions. Likewise, the utilization sensor group 144 may lack an electromagnetic field sensor array 135. The earth-based detection sensors 105 may likewise not be sufficiently dense to provide three-dimensional mapping of cloud charge regions, e.g. less than 10 sensors 105 within a radius of 20 km.

Figure 2A:
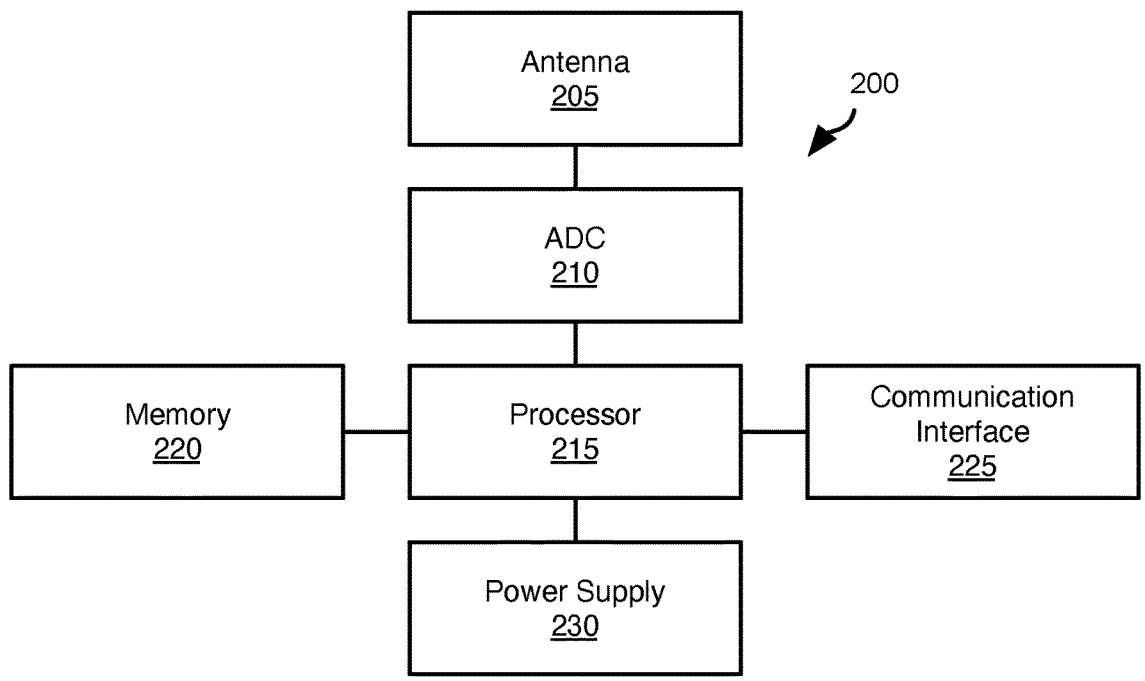
FIG. 2A is an example earth-based lightning detection sensor.

FIG. 2A is an example earth-based lightning detection sensor 200, arranged in accordance with at least one embodiment described herein. The earth-based lightning detection sensor 200 may include or correspond to one or more of the earth-based lightning detection sensors 105 of FIG. 1A. In at least one embodiment, the earth-based lightning detection sensor 200 may include an antenna 205, an analog-to-digital converter (ADC) 210, a processor 215, a memory 220, a communication interface 225, and/or a power supply 230. Various other components may also be included.

In some embodiments, the earth-based lightning detection sensor 200 may, for example, detect lightning pulses emitted by lightning discharges in an environmental space and/or may measure different characteristics of the lightning pulses. For example, the earth-based lightning detection sensor 200 may receive and detect at the antenna 205 lightning pulses at one or more of low frequency (LF), very low frequency (VLF), and/or ultra low frequency (ULF). LF may include frequencies in the range 30 kHz to 300 kHz. VLF may include frequencies in the range 3 kHz to 30 kHz. ULF may include frequencies in the range 0.3 kHz to 3 kHz. In other embodiments, the earth-based lightning detection sensor 200 may receive and detect at the antenna 205 lightning pulses at other frequencies instead of or in addition to the foregoing range of detection frequencies. For instance, the detection frequencies may extend at least partially into medium frequency (MF) (300 kHz to 3 MHz). In comparison, earth-based lightning detection sensors 105 that provide three-dimensional charge mapping, such as may be included in the training sensor group 142, may detect frequencies in the very high frequency (VHF) range, e.g. 30 to 300 MHz. For example, the LMA may operate in the VHF range. The antenna 205 may output, for each detected lightning pulse, an analog signal that represents the lightning pulse.

In some embodiments, the ADC 210 may convert the received analog signal for each lightning pulse into a digital signal or digital data. The digital signal or digital data may include a digital representation of the lightning pulse or portions or features thereof. The digital signal or digital data, for example, may be stored by the processor 215 in the memory 220. The digital signal or digital data, for example, may be communicated to an external device, such as the server 120, via the communication interface 225, as earth-based lightning data.

In some embodiments, the processor 215 may process the digital signal or digital data to determine a type of the associated lightning pulse. In some embodiments, the processor 215 may include one or more components of the computational system 400 of FIG. 4. In some embodiments, the processor 215 may include one or more servers located in one or more locations and/or located at various distributed locations. Although the processing of the earth-based lightning data, and in particular the digital signal or digital data, to determine a type of the associated lightning pulse is described as being performed by the processor 215 at the earth-based lightning detection sensor 200, in other embodiments, the processing may be performed remotely, e.g., at the server 120 of FIG. 1A. The processor 215 may more generally include any suitable processing device, such as a processor, a microprocessor, a controller, a microcontroller, a field programmable gate array (FPGA), an application specific integrated circuit (ASIC), a digital signal processor (DSP), or other suitable processing device.

In some embodiments, the memory 220 may include a disk drive, a drive array, an optical storage device, a solid-state storage device, such as random access memory ("RAM") and/or read-only memory ("ROM"), which can be programmable, flash-updateable, and/or the like.

In some embodiments, the communication interface 225 may include a modem, a network card (wireless or wired), an infrared communication device, a wireless communication device, and/or a wireless communication chipset. In some embodiments, the communication interface 225 may communicate with a wireless network such as, for example, a wireless LAN, a cellular network, a LTE network, a CDMA network, a GSM network, a microwave network, a long range Wi-Fi network, a satellite network, and/or other suitable network. The communication interface 225 may transmit data such as, for example, earth-based lightning data, to the server 120 (or another device) via the network 115 (or other network).

In some embodiments, the earth-based lightning detection sensor 200 may be mounted on a concrete ground pad, while in other embodiments, the earth-based lightning detection sensor 200 may also include non-ground mounting options. The earth-based lightning detection sensor 200 may be used to perform and/or control performance of one or more of the methods or operations of the embodiments described herein. For example, the earth-based lightning detection sensor 200 may be used to perform any calculation, solve any equation, perform any identification, and/or make any determination described herein.

In some embodiments, the earth-based lightning detection sensor 200 may include either a DC power supply 230 or an AC power supply 230.

Figure 2B:
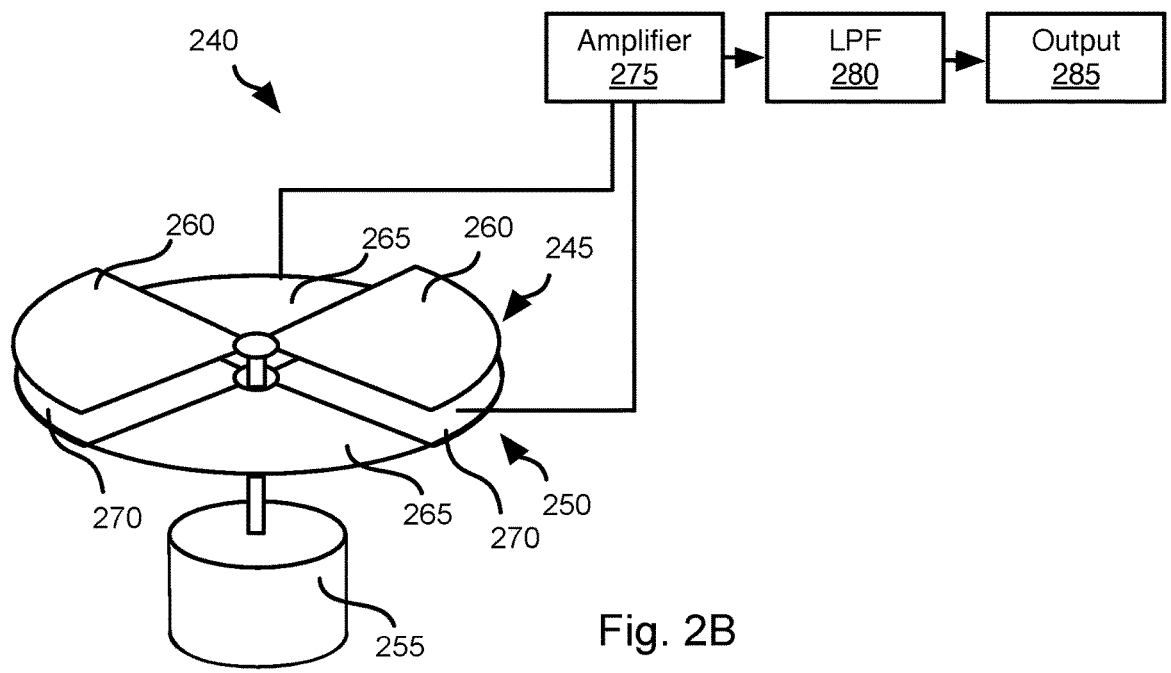
FIG. 2B is an example electric field sensor.

Referring to FIG. 2B, an electric field sensor 240 may be an element of any of the one or more arrays 135 of FIG. 1A. The illustrated electric field sensor 240 is an "E mill" type sensor as known in the art. The electric field sensor 240 may include a shutter 245 that rotates relative to a sensor plate 250, the rotation being induced by a motor 255 coupled to the shutter 245. The shutter 245 includes one or more lobes 260 and the sensor plate 250 includes sectors 265, 270, that may be equal in number to twice the number of lobes 260 and arranged around the sensor plate 250 in an alternating fashion (sector 265, sector 270, sector 265, and sector 270). The sectors 265 may be electrically isolated from the sectors 270. As the shutter 245 is rotated the lobes 260 alternate between uncovering the sectors 265 while covering the sectors 270 and covering the sectors 265 while uncovering the sectors 270. A potential difference between the sectors 265 and the sectors 270 is sensed by an amplifier 275 electrically coupled to the sectors 265, 270. The output of the amplifier 275 may be passed through a low pass filter 280, which may remove frequencies resulting from the speed of rotation of the shutter 245. The output of the low pass filter 280 may be coupled to an output 285. The electric field sensor 240 may further include a computing device, such as a computing device including all or some of the ADC 210, processor 215, memory 220, communication interface 225, and power supply 230 as described above with respect to the lightning detection sensor 200 described above with respect to FIG. 2A. Accordingly, the output 285 may be coupled to the ADC 210 of such a device.

The illustrated electric field sensor 240 is just one embodiment of an E mill sensor and any other configuration of an E mill sensor or other electromagnetic field sensor as known in the art may be used to implement the electromagnetic field sensors of the one or more arrays 135. For example, a non-electric field mill (EFM) approach may be used, such as using a flat-plate slow-E-field antenna. For example, electromagnetic field measurements may be obtained using the approach of Zhang, J., 2010: Development and Test of the Langmuir Electric Field Array, M. S. Thesis, Dept. of Electrical Eng., New Mexico Inst. of Mining and Technol (hereinafter "Zhang2"), which is hereby incorporated herein by reference in its entirety.

Some embodiments described herein relate to methods to determine whether CG strokes include and/or are followed by CC. This and other methods, operations, blocks, and/or embodiments thereof may be implemented individually and/or in any combination of two or more.

Although illustrated as discrete blocks, various blocks may be divided into additional blocks, combined into fewer blocks, or eliminated, depending on the desired implementation.

Figure 3A:
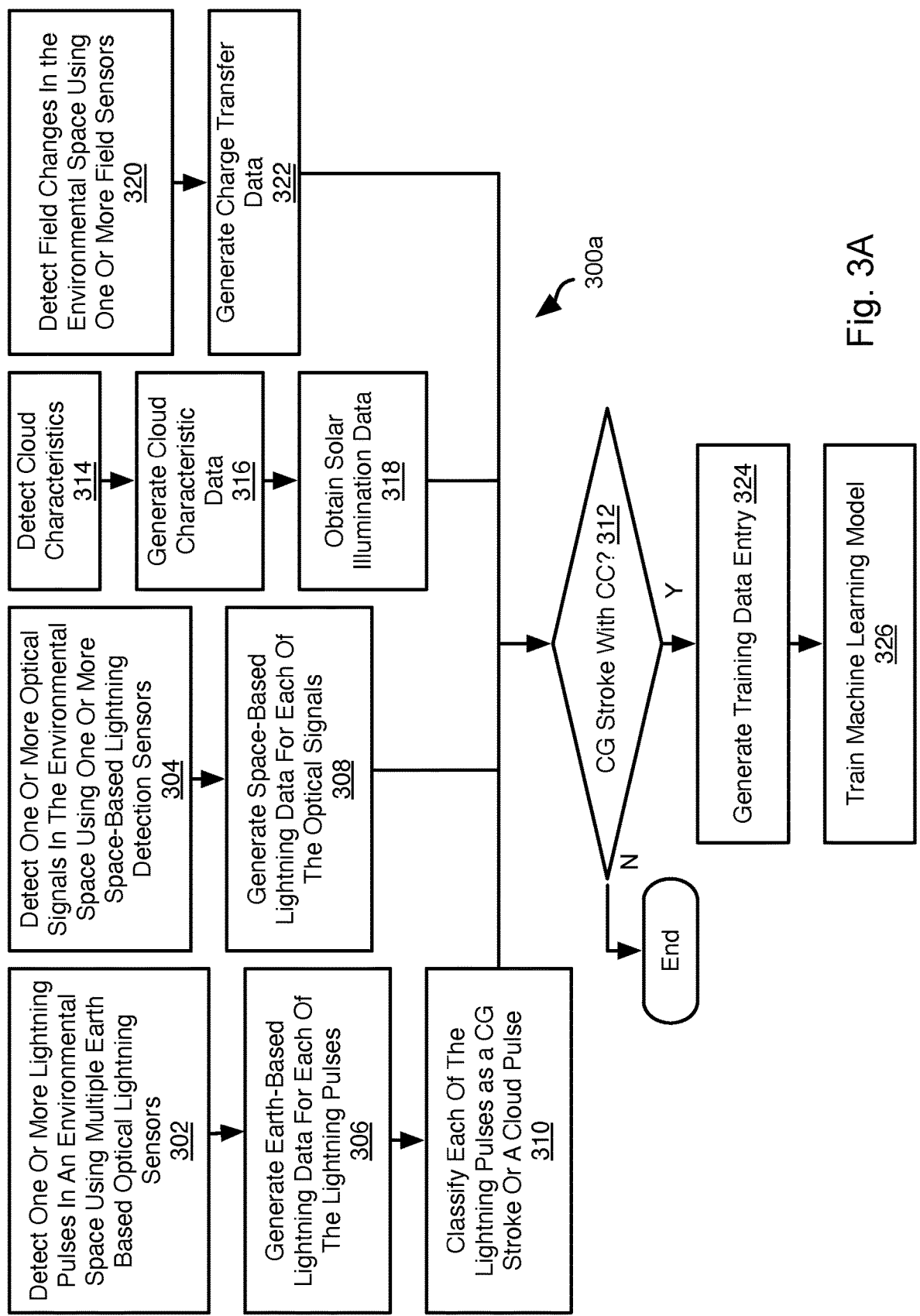
FIG. 3A is a flowchart of an example method to obtain training data for training a machine learning model using the lightning charge transfer quantification system.

FIG. 3A is a flowchart of an example method 300a to train a machine learning model 155 to quantify charge transfer based on observations of CG strokes that include and/or are followed by CC, the method 300a being arranged in accordance with at least one embodiment described herein. The method 300a may be performed, in whole or in part, in or by the system 100 of FIG. 1A, the earth-based lightning detection sensor 200 of FIG. 2, one of the one or more space-based lightning detection sensors 110 of FIG. 1A, one of the electric field sensors 240, and/or in other systems, devices, and/or configurations. Alternatively or additionally, some or all of the method 300a may be controlled by a computer or processor device, such as the server 120 of FIG. 1A, the processor 215 of FIG. 2, and/or the computational system 400 of FIG. 4. The method 300a may include one or more of blocks 302, 304, 306, 308, 310, 312, 314, 316, 318, 320, 322, 324, and/or 326. The method 300a may begin at block 302. Alternatively, blocks 302, 304, 314, and 320 may be performed independently in a parallel or overlapping fashion such that any one of these blocks may be performed first or overlapping with one or more other blocks.

In block 302, one or more lightning pulses may be detected in an environmental space over a period of time using multiple earth-based lightning detection sensors, such as any of the one or more earth-based lightning detection sensors 105 of FIG. 1A or FIG. 2A. The lightning pulses may be detected by, e.g., the antenna 205 of FIG. 2A generating an analog signal representative of each lightning pulse received at the antenna 205. Block 302 may be followed by block 306.

In block 306, earth-based lightning data 160 may be generated for each of the lightning pulses detected in the environmental space using the one or more earth-based lightning detection sensors 105. The earth-based lightning data may include one or more of a geolocation of each lightning pulse, a time of occurrence of each lightning pulse, an estimate of the maximum current associated with each lightning pulse, and/or features of the time-varying voltage of each lightning pulse, such as a duration (e.g., length of time) of each lightning pulse. Block 306 may further include populating the earth-based lightning data 160 with any of the data described with respect to FIG. 1A as possibly being included in the earth-based lightning data 160 of a training data entry 150. In an example, the earth-based lightning data may be generated by the server 120 of FIG. 1A or the processor 215 of FIG. 2A from data output by two or more of the earth-based lightning detection sensors 105 of FIG. 1A and/or output by the ADC 210 of FIG. 2A. Block 306 may be followed by block 310.

In block 310, each of the lightning pulses may be classified as a CG stroke or a cloud pulse. Block 310 may include classifying at least one of the lightning pulses as a CG stroke. The lightning pulses may be classified as CG strokes or cloud pulses based on the earth-based lightning data. For instance, the earth-based lightning data 160 detected for each lightning pulse may include a time-varying voltage; a shape of a plot of the time-varying voltage, or other information in or derived from the earth-based lightning data for a given lightning pulse, may be used to classify each lightning pulse as a cloud pulse or a CG stroke. Block 310 may be followed by block 312.

In some embodiments, block 304 and/or block 308 may be performed in parallel with one or more of blocks 302, 306, and/or 310. In block 304, one or more optical signals may be detected in the environmental space over the period of time using one or more space-based lightning detection sensors, such as the one or more space-based lightning detection sensors 110 of FIG. 1A. In some embodiments, detecting optical signals using one or more space-based lightning detection sensors may include detecting optical signals or other light emitted by the lightning pulses. Block 304 may be followed by block 308.

In block 308, space-based lightning data 165 may be generated for each of the optical signals detected in the environmental space using the one or more space-based lightning detection sensors 110. The space-based lightning data 165 may include one or more of a geolocation of each optical signal, an intensity of each optical signal, an area of each optical signal, a time of occurrence of each optical signal, and/or a duration (e.g., length of time) of each optical signal. In an example, the space-based lightning data may be generated by the one or more space-based lightning detection sensors 110 of FIG. 1A and may be transmitted to and received by the server 120 of FIG. 1A. In some embodiments, the server 120 may analyze the space-based lightning data 165 and determine one or more contiguous groups, e.g., by assigning optical signals identified in the space-based lightning data into contiguous groups of optical signals according to any suitable algorithm, such as the algorithm described above. In other embodiments, the one or more contiguous groups may be defined by and/or included in the space-based lightning data received by the server 120 from the space-based lightning detection sensor 110. The identified one or more contiguous groups may be added to the space-based lightning data 165. Block 308 may further include populating the space-based lightning data 165 with any of the data described with respect to FIG. 1A as possibly being included in the lightning data 165 of a training data entry 150. Block 308 may be followed by block 312.

In some embodiments, blocks 314 and/or 316 may be performed in parallel with one or more of blocks 302, 304, 306, 308, and/or 310. In block 314, cloud characteristics may be detected. The cloud characteristics may be detected for clouds associated with the lightning pulses and/or the optical signals. Alternatively or additionally, the cloud characteristics may be detected for clouds associated with lightning pulses that are classified as CG strokes. The cloud characteristics may be detected by one or more sensors co-located with the one or more space-based lightning detection sensors 110. In an example, the cloud characteristics may be detected by the cloud characteristic sensor 130 of FIG. 1 and/or by one or more sensors co-located with the one or more space-based lightning detection sensor 110 of FIG. 1A. Block 314 may be followed by block 316.

In block 316, cloud characteristic data 170 may be generated. The cloud characteristic data may be generated for the clouds associated with the lightning pulses and/or the optical signals. The cloud characteristic data 170 may include one or more of a cloud top altitude, a cloud top temperature, a cloud amount, a cloud optical depth, an area of the cloud below a threshold temperature, and whether the cloud top consists primarily of ice crystals or supercooled liquid water droplets. Block 316 may be followed by block 312. Block 316 may be followed by, preceded by, or performed concurrently with block 318

In block 318, solar illumination data 175 is obtained for the time of occurrence of the CG stroke determined to have occurred at block 310. As described above, this may include determining a sun-angle at the geolocation of the CG stroke at the time of occurrence of the CG stroke and recording this sun-angle as the solar illumination data 175.

In some embodiments, block 320 and/or block 322 may be performed in parallel with one or more of blocks 302, 304, 306, 308, 310, 314, 316, and/or 318. In block 320, electromagnetic field changes in the environmental space may be detected. The electromagnetic field changes may include electric field changes and/or magnetic field changes. The electromagnetic field changes may be detected using one or more of the arrays 135. In some embodiments, electric field changes are recorded by at least two, or in some cases at least three to four, electric field sensors in the vicinity of the CG stroke, e.g. electric field changes measured in a time window (e.g., from 8 to 500 ms) that includes the time of occurrence of the CG stroke determined to have occurred at block 310 and in the vicinity (e.g., within about 20 km) of the geolocation of the CG stroke determined to have occurred at block 310.

The electromagnetic field changes measured at block 320 may be processed at block 322 to generate charge transfer data 180. Processing the electromagnetic field changes or generating the charge transfer data 180 may include deriving a quantification of charge transfer corresponding to the electromagnetic field changes and the geolocation of the CG stroke determined to have occurred at block 310. The electromagnetic field changes may include measured electric field changes processed according to Maggio to obtain charge transfer data and/or measured magnetic field changes obtained using the approach of Zhang1 and further processed to obtain charge transfer data. Block 322 may include using the approach of Maggio to quantify the charge transfer of the CG stroke, the CC, or the combination of the CG stroke and the CC. The result of applying the approach of Maggio at block 322 may be used as the charge transfer data 180. Block 322 may be followed by block 312. In some embodiments, determinations of charge transfer are only relevant where a CG stroke is determined to include or be followed by CC. Accordingly, in some embodiments, block 322 may be performed only where the CG stroke is determined to include or be followed by CC at block 312. Block 320 may be performed automatically or by a third party such that it either is or is not omitted in such embodiments.

In block 312, for each CG stroke determined at block 310, it may be determined whether the CG stroke includes or is followed by CC. The determination of whether each CG stroke includes or is followed by CC may be based on the space-based lightning data generated at block 308. For instance, a given CG stroke may be determined to include or be followed by CC based on the space-based lightning data as described above.

The method 300a may further include a step to correlate lightning pulses represented in the earth-based lightning data 160 with optical signals represented in the space-based lightning data 165, e.g., prior to block 312. The lightning pulses and/or optical signals represented in the different types of lightning data 160, 165 (e.g., earth-based or space-based) may be correlated based on one or more of geolocation, time of occurrence, duration, and/or other potentially identifying features of the lightning pulses and/or optical signals.

For instance, each of the CG strokes determined at block 310 from the earth-based lightning data may have a geolocation, time of occurrence, and/or duration included in the earth-based lightning data 160. For each CG stroke determined from the earth-based lightning data, any combination of the geolocation, time of occurrence, and/or duration may serve as a signature or fingerprint for the CG stroke.

Analogously, each of the optical signals represented in the space-based lightning data 165 and/or each contiguous group of optical signals, may have a geolocation, time of occurrence, and/or duration included in the space-based lightning data 165. For each optical signal represented by the space-based lightning data or contiguous group of optical signals, any combination of the geolocation, time of occurrence, and/or duration may serve as a signature or fingerprint.

In some embodiments, the lightning pulses, including the CG strokes, represented in the earth-based lightning data 160 may be correlated with the optical signals represented in the space-based lightning data 165 and/or contiguous groups of optical signals by comparing the signatures or fingerprints of each, e.g. determining the similarity of the geolocation, time of occurrence, and duration of one signature or fingerprint to the respective geolocation, time of occurrence, and duration for the other signature or fingerprint. If the signature or fingerprint of a CG stroke represented in the earth-based lightning data matches, or is at least consistent with, the signature or fingerprint of an optical signal represented in the space-based lightning data or of a contiguous group of optical signals, the CG stroke represented in the earth-based lightning data may be determined to be the same as and thereby associated with, or may at a minimum be correlated with, the corresponding optical signal represented in the space-based lightning data or the corresponding contiguous group of optical signals. Thus, the intensity, duration, and/or other data of the optical signal in the space-based lightning data or of the contiguous group of optical signals may be used at block 312 to determine if the corresponding CG stroke in the earth-based lightning data includes or is followed by CC.

In a like manner, the time of occurrence, geolocation, and duration of charge transfers or electromagnetic field amplitudes recorded in the charge transfer data 180 may serve as a signature or finger print of the charge transfer data 180 and may be compared with the finger prints of the earth-based lightning data 160 and the space-based lightning data 165, e.g. determining the similarity of the geolocation, time of occurrence, and duration of one signature or fingerprint to the respective geolocation, time of occurrence, and duration for the other signature or fingerprint. If the signature or fingerprint of the charge transfer data 180 matches, or is at least consistent with, the signature or fingerprint of the earth-based lightning data 160 and/or space-based data 165, the charge transfer data 180 may be determined to be an observation of the same CG stroke as the earth-based lightning data 160 and the space-based data 165. In some embodiments, the geolocation of the charge transfer data 180 may be determined from the one or more earth-based lightning detection sensors 105 that provide three-dimensional charge mapping, such as may be included in the training sensor group 142, or it may be determined based on the measured electromagnetic fields and known locations of the electromagnetic field sensors of the one or more arrays 135 that sensed the CG stroke, or it may be determined from the earth-based lightning data 160. Alternatively, the location or average location of the electromagnetic field sensors may be used as the geolocation for the charge transfer data 180.

One or more outputs of the method 300a to determine whether CG strokes include and/or are followed by CC may be used to generate a warning about a potential fire. For instance, the method 300a may determine that a CG stroke includes or is followed by CC and may notify a fire department or public officials located near the CG stroke to warn of a possible fire due to the CC included in or following the CG stroke.

If the CG stroke is determined to have included or have been followed by CC at block 312, block 324 may be performed, which may include generating a training data entry 150 that includes all or some of the earth-based lightning data 160 from block 306, the space-based lightning data 165 from block 308, the cloud characteristic data 170 from block 316, and the solar illumination data 175 from block 318. The training data entry 150 may further include charge transfer data 180 from block 322 correlated to the earth-based lightning data 160 and/or the space-based lightning data 165.

In some embodiments, the machine learning model 155 may be trained to identify either or both of whether a CG stroke includes or is followed by CC and the charge transfer of the lightning stroke. Accordingly, in some embodiments, block 312 may be omitted and block 324 may be performed regardless of whether a CG stroke is determined to include or be followed by CC.

In some embodiments, the training data entries 150 may filtered or vetted to remove training data entries 150 that are of insufficient quality. For example, where the geolocation of the CG stroke represented by a training data entry is not sufficiently close to, e.g. further than 20 km from, one or more of the electromagnetic field sensors of one of the one or more arrays 135, no training data entry 150 for that CG stroke is used to train the machine learning model 155. Quality may be based on characteristics of the data itself, e.g. amount of noise present in the recorded signals from the electromagnetic field sensors of the one or more arrays 135 (e.g., signal to noise ratio above a predefined noise threshold). Quality may also be based on a degree of correlation of the charge transfer data 180 to the earth-based lightning data 160 and/or space-based lightning data 165. For example, if a time-varying shape of electromagnetic fields used to obtain the charge transfer data 180 does not have a required degree of correlation to the time-varying shape of lightning pulses represented by the earth-based lightning data 160, the training data entry 150 may be discarded. In some embodiments, a training data entry 150 is not created for an observed CG stroke where there is a lack of detection of a continuous optical signal (e.g., detection of a lightning flash in at least five consecutive images) for the CG stroke by the one or more space-based lightning detection sensors 110.

After many vetted training data entries 150 have been generated for many CG strokes, the method 300a may include performing block 326, which may include training the machine learning model 155 using the training data entries 150. The number of training data entries 150 used to train and validate the model 155 may include more than 300, more than 600, more than 1000, or more than some other number. Training at block 326 may include performing training according to the type of the machine learning model 155 and may include both a training phase with a first portion (e.g., 50 to 80 percent) of the training data entries 150 followed by a validation phase using a remaining portion of the training data entries 150 not included in the first portion.

Training of the machine learning model 155 may further include drawing inferences between the amount of charge transfer and one or more items of data in the training data entries 150. For example, multiple linear regression or other machine learning technique may be used to determine a relationship between cloud characteristics in the cloud characteristic data 170 and the amount of charge transfer in the charge transfer data 180. In particular, cloud characteristics can affect the near-infrared emissions observed from the lightning, so the relationship between the cloud characteristics and charge transfer may be determined.

In another example, a relationship between charge transfer and attributes of optical groups recorded in the space-based lightning data 165 may be determined. For example, it may be advantageous to determine whether the amount of charge transferred is related to the fraction of pixels within the optical groups whose measured intensities exceed some threshold. Alternatively or additionally, a relationship may be determined between the amount of charge transferred and the fraction of pixels of the optical groups whose measured intensity exceeds an intensity threshold and which correspond to portions of clouds having a cloud top temperature below a temperature threshold as indicated in the cloud characteristic data 170.

For this and other procedures and methods disclosed herein, the functions or operations performed in the processes and methods may be implemented in differing order. Furthermore, the outlined operations are only provided as examples, and some of the operations may be optional, combined into fewer operations, supplemented with other operations, or expanded into additional operations without detracting from the disclosed embodiments.

Figure 3B:
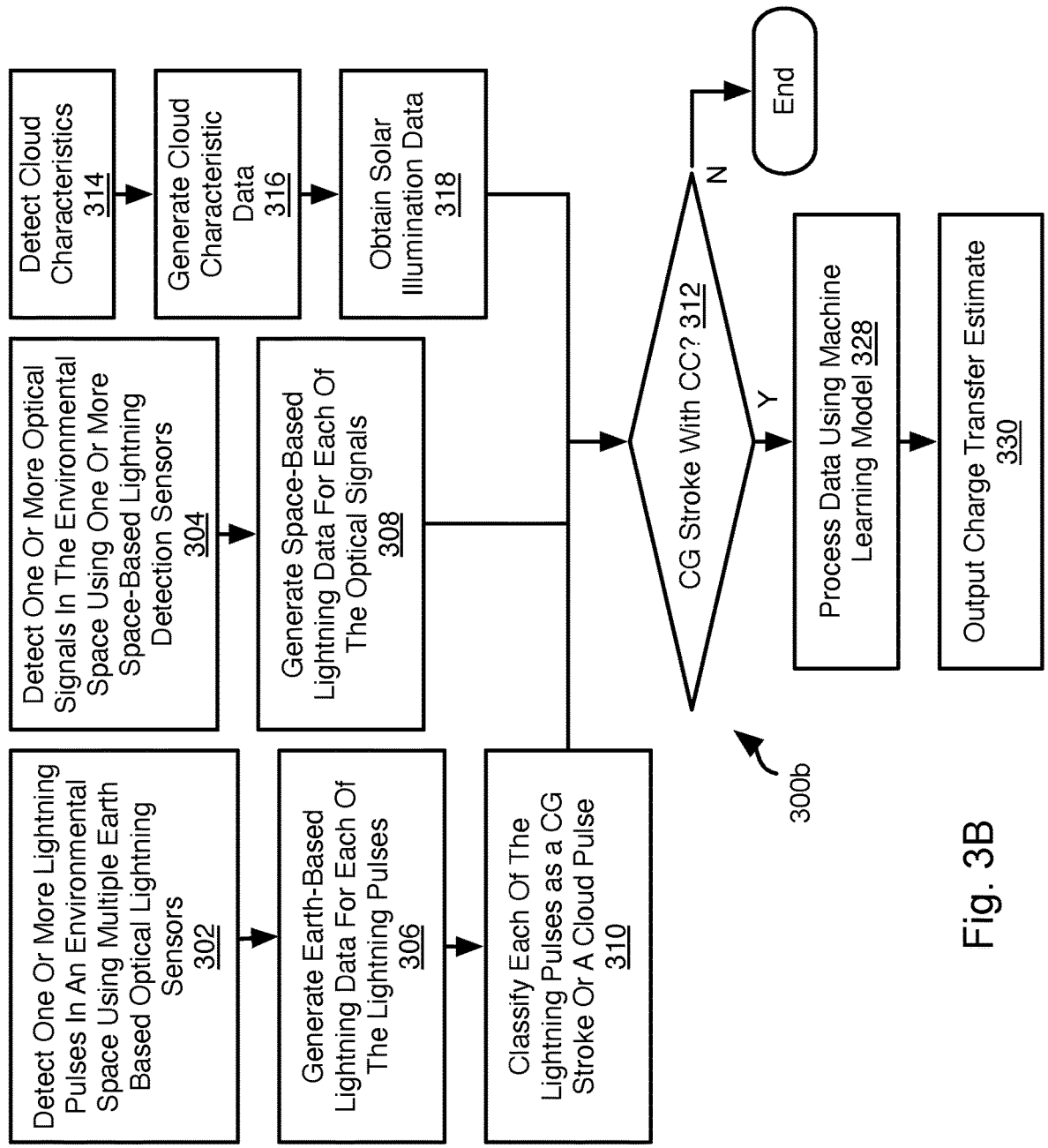
FIG. 3B is a flowchart of an example method to quantify lightning charge transfer.

FIG. 3B illustrates a method 300b that may be executed following generation of the machine learning model 155. The method 300b may be performed after generation of the machine learning model 155 for CG strokes having geolocations that are not in the vicinity (e.g., within 20 km) of any of the one or more arrays 135. The method 300b may also be used in instances the geolocation of the CG stroke is out of range of (e.g., further than 20 km away from) the one or more arrays 135 and where high-resolution three-dimensional mapping of charge regions is not available from any earth-based lightning detection sensors 105 that observed the CG stroke, which is the case at most locations across the globe due to the high cost to acquire and operate such equipment. The machine learning model 155 may continue to be updated as additional training data entries 150 are created according to the method 300a for CG strokes that do occur in the vicinity of at least one of the one or more arrays 135.

The method 300b may include performing the functionality of some or all of blocks 302, 304, 306, 308, 310, 314, 316, and 318 as described above with respect to observations of a CG stroke obtained from the one or more earth-based lightning detection sensors 105 and the one or more space-based lightning detection sensors 110, resulting in all or some of earth-based lightning data 160, space-based lightning data 165, cloud characteristic data 170, and solar illumination data 175.

Likewise, the function of block 312 as described above may be performed to determine whether the CG stroke includes or is followed by CC. If so, all or some of the earth-based lightning data 160, space-based lightning data 165, cloud characteristic data 170, and solar illumination data 175 representing the CG stroke may be processed at block 328 using the machine learning model 155. The result of the processing of block 328 may be output at block 330 and may include an estimate of charge transfer resulting from the CG stroke. The output at block 330 may include a confidence value indicating a probability of accuracy of the charge transfer estimate according to the machine learning model 155.

In some embodiments, the machine learning model 155 may be trained with training data entries 150 for CG strokes that include and/or are followed by CC and those that do not include and are not followed by CC. Accordingly, in such embodiments, block 312 may be omitted. The s magnitude of the estimate of charge may be used to determine whether the CG stroke included or was followed by CC, e.g. a charge transfer estimate above a predefined first threshold may be determined to indicate that CG stroke included or was followed by CC.

Generating an output in block 330 may include generating a warning about a potential fire. For instance, when the charge transfer estimate exceeds a second predefined threshold, that may be higher than the first threshold, the method 300b may include notifying a fire department or public officials located near the CG stroke to warn of a possible fire due to the magnitude of the charge transfer.

FIG. 4 includes a block diagram of an example computational system 400 (or processing unit), arranged in accordance with at least one embodiment described herein. The computational system 400 may be used to perform and/or control operation of any of the embodiments described herein. For example, the computational system 400 may be used alone or in conjunction with other components. As another example, the computational system 400 may be used to perform any calculation, solve any equation, perform any identification, and/or make any determination described herein. The computational system 400 is an example implementation of the server 120 of FIG. 1A.

The computational system 400 may include any or all of the hardware elements shown in FIG. 4 and described herein. The computational system 400 may include hardware elements that may be electrically coupled via a bus 405 (or may otherwise be in communication, as appropriate). The hardware elements may include one or more processors 410, including one or more general-purpose processors and/or one or more special-purpose processors (such as digital signal processing chips, graphics acceleration chips, and/or other suitable processors); one or more input devices 415, which may include a mouse, a keyboard, or other suitable input device; and one or more output devices 420, which may include a display device, a printer, and/or other suitable output devices.

The computational system 400 may further include (and/or be in communication with) one or more storage devices 425, which may include local and/or network-accessible storage, a disk drive, a drive array, an optical storage device, a solid-state storage device, such as a RAM, and/or ROM, which may be programmable, flash-updateable, and/or the like. The computational system 400 might also include a communication subsystem 430, which may include a modem, a network card (wireless or wired), an infrared communication device, a wireless communication device, and/or chipset (such as a Bluetooth® device, a 802.6 device, a Wi-Fi device, a WiMAX device, cellular communication facilities, etc.), and/or the like. The communication subsystem 430 may permit data to be exchanged with a network (such as the networks described herein) and/or any other systems and/or devices described herein. In many embodiments, the computational system 400 may further include a working memory 435, which may include a RAM or ROM device, as described above.

The computational system 400 may also include software elements, which may be located within the working memory 435. Also, the computational system 400 may include an operating system 440 and/or other code, such as one or more application programs 445, which may include computer programs, and/or may be designed to implement the methods, and/or configure the systems, as described herein. For example, one or more operations or procedures described with respect to the method(s) discussed above might be implemented as code and/or instructions executable by a computer (and/or a processor within a computer). A set of these instructions and/or codes may be stored on a computer-readable storage medium, such as the storage device(s) 425 described above.

In some embodiments, the storage medium may be incorporated within the computational system 400 or in communication with the computational system 400. In other embodiments, the storage medium might be separate from the computational system 400 (e.g., a removable medium, such as a compact disc, etc.), and/or provided in an installation package, such that the storage medium may be used to program a general-purpose computer with instructions/code stored thereon. These instructions may take the form of executable code, which may be executable by the computational system 400 and/or may take the form of source and/or installable code, which, upon compilation and/or installation on the computational system 400 (e.g., using any of a variety of generally available compilers, installation programs, compression/decompression utilities, etc.), takes the form of executable code.

Various embodiments are disclosed herein. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing art to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical, electronic, or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited unless context indicates otherwise. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed:

1. A method to quantify charge transfer in continuing current lightning events, the method comprising:
   for each first lightning event of a plurality of first lightning events:
      obtaining one or more first measurements of each first lightning event from at least one of one or more earth-based lightning detection sensors or one or more space-based lightning detection sensors;
      obtaining a first charge transfer estimate of each first lightning event using field measurements of each first lightning event from one or more arrays of electromagnetic field sensors; and
      associating the one or more first measurements with the first charge transfer estimate in a training data entry of a plurality of training data entries, the plurality of training data entries corresponding to the plurality of first lightning events; and
   training a machine learning model using the plurality of training data entries.

2. The method of claim 1, further comprising:
   receiving one or more second measurements of a second lightning event by the at least one of the one or more earth-based lightning detection sensors or the one or more space-based lightning detection sensors without receiving any outputs from the one or more arrays of electromagnetic field sensors; and
   processing the one or more second measurements using the machine learning model to obtain a second charge transfer estimate.

3. The method of claim 1, wherein the plurality of first lightning events include at least three hundred first lightning events.

4. The method of claim 1, wherein all of the plurality of first lightning events include cloud-to-ground lightning strokes that at least one of include or are followed by continuing current (CC) as determined from the one or more first measurements.

5. The method of claim 1, wherein the machine learning model is a multiple linear regression model.

6. The method of claim 1, further comprising, for each first lightning event of the plurality of first lightning events, correlating the first charge transfer estimate to the one or more first measurements by determining correlation between at least one of:
   a geolocation of each first lightning event indicated in the one or more first measurements and a geolocation of an array of the one or more arrays of electromagnetic field sensors that detected each first lightning event; or
   a time of detection of the one or more first measurements and a time of detection of the field measurements.

7. The method of claim 1, wherein the at least one of the one or more earth-based lightning detection sensors or the one or more space-based lightning detection sensors include at least one space-based lightning detection sensor; and
   wherein the one or more first measurements include at least one of:
      a duration of an optical emission from each first lightning event over a particular time-space area indicated by a set of optical groups, each optical group of the set of optical groups including adjacent pixels corresponding to each first lightning event in an image of a set of consecutive images captured by the at least one space-based lightning detection sensor;
      a maximum intensity of the set of optical groups;
      a sum of intensities of the set of optical groups;
      a maximum area covered by any one optical group of the set of optical groups; or
      a sum of all areas of the set of optical groups.

8. The method of claim 1, wherein the one or more first measurements include cloud properties detected by a space-based cloud characteristic detection sensor, the detected cloud properties including at least one of cloud top altitude, cloud top temperature, cloud optical depth, or a cloud area below a temperature threshold.

9. The method of claim 1, further comprising including solar illumination data in the training data entry for each first lightning event, the solar illumination data indicating a sun angle at a time of occurrence of each first lightning event at a geolocation indicated in the one or more first measurements.

10. The method of claim 1, wherein the one or more first measurements include measurements of one or more properties for each first lightning event and for each property of the one or more properties:
   time from crossing of a threshold to peak amplitude;
   time from peak amplitude to amplitude falling below the threshold; and
   peak amplitude.

11. The method of claim 1, wherein the one or more first measurements include in-cloud measurements of one or more in-cloud lightning pulses following a return stroke of each first lightning event and, for each in-cloud lightning pulse of the one or more in-cloud lightning pulses, the in-cloud measurements including at least one of a duration, polarity, or peak amplitude.

12. A non-transitory computer-readable medium having computer-readable instructions stored thereon that are executable by a processor device to perform or control performance of operations comprising:
   for each first lightning event of a plurality of first lightning events:
      obtaining one or more first measurements of each first lightning event from at least one of one or more earth-based lightning detection sensors or one or more space-based lightning detection sensors;
      obtaining a first charge transfer estimate of each first lightning event using field measurements of each first lightning event from one or more arrays of electromagnetic field sensors; and
      associating the one or more first measurements with the first charge transfer estimate in a training data entry of a plurality of training data entries, the plurality of training data entries corresponding to the plurality of first lightning events; and
   training a machine learning model using the plurality of training data entries.

13. The non-transitory computer-readable medium of claim 12, wherein the operations further comprise:
receiving one or more second measurements of a second lightning event by the at least one of the one or more earth-based lightning detection sensors or the one or more space-based lightning detection sensors without receiving any outputs from the one or more arrays of electromagnetic field sensors; and
processing the one or more second measurements using the machine learning model to obtain a second charge transfer estimate.

14. The non-transitory computer-readable medium of claim 12, wherein the operations further comprise selecting the plurality of first lightning events as all including cloud-to-ground lightning strokes that at least one of include or are followed by continuing current (CC) as determined from the one or more first measurements.

15. The non-transitory computer-readable medium of claim 12, wherein the operations further comprise, for each first lightning event of the plurality of first lightning events, correlating the first charge transfer estimate to the one or more first measurements according to correlation between at least one of:
a geolocation of each first lightning event indicated in the one or more first measurements and a geolocation of an array of the one or more arrays of electromagnetic field sensors that detected each first lightning event; or
a time of detection of the one or more first measurements and a time of detection of the field measurements.

16. The non-transitory computer-readable medium of claim 12, wherein the one or more first measurements include at least one of:
a duration of an optical emission from each first lightning event over a particular time-space area indicated by a set of optical groups, each optical group of the set of optical groups including adjacent pixels corresponding to each first lightning event in an image of a set of consecutive images captured by the at least one of the one or more earth-based lightning detection sensors and the one or more space-based lightning detection sensors;
a maximum intensity of the set of optical groups;
a sum of intensities of the set of optical groups;
a maximum area covered by any one optical group of the set of optical groups; or
a sum of all areas of the set of optical groups.

17. The non-transitory computer-readable medium of claim 12, wherein the one or more first measurements include cloud properties detected by a space-based cloud characteristic sensor, the cloud properties including at least one of cloud top altitude, cloud top temperature, cloud optical depth, or a cloud area below a temperature threshold.

18. The non-transitory computer-readable medium of claim 12, wherein the operations further comprise including solar illumination data in the training data entry for each first lightning event, the solar illumination data indicating a sun angle at a time of occurrence of each first lightning event at a geolocation indicated in the one or more first measurements.

19. The non-transitory computer-readable medium of claim 12, wherein the one or more first measurements include measurements of one or more properties of each first lightning event and for each property of the one or more properties:
time from threshold crossing to peak amplitude;
time from peak amplitude to below-threshold amplitude; and
peak amplitude.

20. A lightning detection system, comprising:
one or more arrays of electromagnetic field sensors configured to detect changes in electromagnetic fields in an environmental space; and
a processor device communicatively coupled to one or more space-based lightning detection sensors configured to detect one or more optical signals in the environmental space, wherein the processor device is configured to perform or control performance of operations comprising:
for each first lightning event of a plurality of first lightning events:
obtaining one or more first measurements of each first lightning event from the one or more space-based lightning detection sensors;
obtaining a first charge transfer estimate of each first lightning event using field measurements of each first lightning event from the one or more arrays of electromagnetic field sensors; and
associating the one or more first measurements with the first charge transfer estimate in a training data entry of a plurality of training data entries, the plurality of training data entries corresponding to the plurality of first lightning events;
training a machine learning model using the plurality of training data entries;
receiving one or more second measurements of a second lightning event from the one or more space-based lightning detection sensors without receiving any outputs from the one or more arrays of electromagnetic field sensors; and
processing the one or more second measurements using the machine learning model to obtain a second charge transfer estimate.

* * * * *